United States Patent
Lee et al.

(10) Patent No.: US 11,069,761 B2
(45) Date of Patent: Jul. 20, 2021

(54) DISPLAY PANEL AND DISPLAY APPARATUS INCLUDING THE SAME

(71) Applicant: SAMSUNG DISPLAY CO., LTD., Yongin-si (KR)

(72) Inventors: Jeongho Lee, Yongin-si (KR); Minju Kim, Yongin-si (KR); Wonho Kim, Yongin-si (KR); Keunsoo Lee, Yongin-si (KR); Kyungcahn Chae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/751,428

(22) Filed: Jan. 24, 2020

(65) Prior Publication Data

US 2020/0303478 A1   Sep. 24, 2020

(30) Foreign Application Priority Data

Mar. 19, 2019   (KR) .......................... 10-2019-0031469

(51) Int. Cl.
| | | |
|---|---|---|
| *H01L 29/08* | (2006.01) | |
| *H01L 27/32* | (2006.01) | |
| *H01L 51/50* | (2006.01) | |

(52) U.S. Cl.
CPC ...... *H01L 27/3258* (2013.01); *H01L 27/3262* (2013.01); *H01L 27/3265* (2013.01); *H01L 27/3276* (2013.01); *H01L 51/5056* (2013.01); *H01L 51/5072* (2013.01); *H01L 51/5092* (2013.01)

(58) Field of Classification Search
CPC . H01L 27/32; H01L 27/3258; H01L 27/3262; H01L 27/3265; H01L 27/3276; H01L 51/5056; H01L 51/5072
See application file for complete search history.

(56) References Cited

U.S. PATENT DOCUMENTS

| | | |
|---|---|---|
| 10,032,835 B2 | 7/2018 | Min et al. |
| 10,135,010 B2 | 11/2018 | Kim et al. |
| 10,135,028 B2 | 11/2018 | Kim et al. |

(Continued)

FOREIGN PATENT DOCUMENTS

| | | |
|---|---|---|
| JP | 2018-87863 | 6/2018 |
| KR | 10-2017-0045459 | 4/2017 |

(Continued)

*Primary Examiner* — Phuc T Dang
(74) *Attorney, Agent, or Firm* — F. Chau & Associates, LLC

(57) ABSTRACT

A display panel includes: a substrate including a first area, a second area, and a third area located between the first area and the second area; a display layer including a display element located in the second area; a first metal layer located in the third area; an organic insulating layer located on the first metal layer and including at least one contact portion; and a second metal layer located on the organic insulating layer and contacting the first metal layer through the at least one contact portion, in which the second metal layer has a first hole, and the organic insulating layer has a second hole or a first recess corresponding to the first hole, and a residual layer located in the second hole or the first recess and including a part of at least one organic layer overlaps the first metal layer.

24 Claims, 25 Drawing Sheets

(56) References Cited

U.S. PATENT DOCUMENTS

| | | | |
|---|---|---|---|
| 10,193,102 B2 | 1/2019 | Kanaya | |
| 2013/0187132 A1* | 7/2013 | Ando | H01L 51/0004 257/40 |
| 2014/0183479 A1* | 7/2014 | Park | H01L 27/3218 257/40 |
| 2017/0148856 A1* | 5/2017 | Choi | H01L 51/0096 |
| 2018/0183015 A1 | 6/2018 | Yun et al. | |
| 2018/0190631 A1* | 7/2018 | Kim | H01L 25/162 |

FOREIGN PATENT DOCUMENTS

| | | |
|---|---|---|
| KR | 10-2017-0133812 | 12/2017 |
| KR | 10-2018-0076429 | 7/2018 |
| KR | 10-2018-0116187 | 10/2018 |

* cited by examiner

DISPLAY PANEL AND DISPLAY APPARATUS INCLUDING THE SAME

CROSS-REFERENCE TO RELATED APPLICATION

This application claims the benefit under 35 U.S.C. § 119 of Korean Patent Application No. 10-2019-0031469, filed on Mar. 19, 2019, in the Korean Intellectual Property Office, the disclosure of which is incorporated by reference herein in its entirety.

TECHNICAL FIELD

The present disclosure relates to a display panel, and more particularly, to a display panel including an area where a component is located inside a display area and a display apparatus including the display panel.

DISCUSSION OF RELATED ART

Display apparatuses have recently been used in various ways. Also, as thicknesses and weights of the display apparatuses decrease, the use of the display apparatuses expands to a wide range of electronic products. At the same time, the resolution of the display apparatuses has increased, and the size of a display area in a display apparatus has also been enlarged.

As the size of the display area in the display apparatus increases, various functions linked to or associated with the display apparatus may be added. Studies have been made on the display apparatus for arranging various elements in the display area to add various functions as the size of the display area increases.

SUMMARY

Exemplary embodiments of the present disclosure include a display panel having a first area where various components may be located in a display area and a display apparatus including the display panel.

Additional aspects will be set forth in part in the description which follows and, in part, will be apparent from the description, or may be learned by practice of the presented exemplary embodiments.

According to an exemplary embodiment of the present disclosure, a display panel includes: a substrate including a first area, a second area, and a third area located between the first area and the second area; a display layer including a pixel circuit located in the second area and a display element electrically connected to the pixel circuit, the display element including a pixel electrode, a counter electrode, and an intermediate layer located between the pixel electrode and the counter electrode and including an emission layer and at least one organic layer; a first metal layer located in the third area; an organic insulating layer located on the first metal layer and including at least one contact portion; and a second metal layer located on the organic insulating layer and contacting the first metal layer through the at least one contact portion, in which the second metal layer has a first hole, and the organic insulating layer has a second hole or a first recess corresponding to the first hole, and a residual layer located in the second hole or the first recess and including a part of the at least one organic layer overlaps the first metal layer.

The display panel may further include an inorganic insulating layer located between the first metal layer and the organic insulating layer.

The second hole may expose at least a part of a top surface of the inorganic insulating layer.

The second hole may extend into the inorganic insulating layer and may expose at least a part of a top surface of the first metal layer.

The at least one contact portion may have a first opening defined in the organic insulating layer and a second opening defined in the inorganic insulating layer, and the first metal layer and the second metal layer may be connected to each other through the at least one contact portion.

The pixel circuit may include a thin-film transistor (TFT) and a storage capacitor electrically connected to the display element, and the second metal layer may include a material the same as that of a contact metal layer that connects the display element to the TFT.

The TFT may include a semiconductor layer, a gate electrode overlapping the semiconductor layer, and a connection electrode electrically connected to the semiconductor layer, and the first metal layer may include a material the same as that of the connection electrode.

The display panel may further include a data line extending in a first direction and configured to transmit a data signal to the display element, in which the data line includes a material the same as that of at least one of the first metal layer and the second metal layer.

The at least one organic layer may include one or more of a hole transport layer, a hole injection layer, an electron injection layer, and an electron transport layer.

The display panel may further include: a partition wall located in the third area and surrounding the first area; and at least one groove each including the first hole and the second hole or the first recess, in which the at least one groove includes a first groove located at a side of the partition wall close to the second area and a second groove located at a side of the partition wall close to the first area.

The first metal layer may be located under the first groove.

The first metal layer may overlap each of the first groove and the second groove and may be discontinuously located under each of the first groove and the second groove.

The first metal layer may be located under the first groove, the partition wall, and the second groove.

The at least one groove may further include a third groove located closer to the first area than the second groove, in which a depth of each of the first groove and the second groove, defined based on a top surface of the organic insulating layer, is less than a depth of the third groove.

The display panel may further include at least one lower insulating layer located under the organic insulating layer, in which the at least one lower insulating layer includes an inorganic insulating layer.

A bottom surface of the third groove may be located on an imaginary surface between a top surface of the substrate and a top surface of the at least one lower insulating layer.

The first metal layer may include a floating metal disconnected from an electrical signal.

The first metal layer may have a ring shape surrounding the first area.

In a plan view, a width of the first metal layer may be greater than a width of the second hole.

The at least one contact portion of the organic insulating layer may include a first contact portion and a second contact portion with at least one groove located therebetween.

The inorganic insulating layer may include a third hole or a second recess corresponding to the second hole and passing through the inorganic insulating layer.

According to an exemplary embodiment of the present disclosure, a display apparatus includes: a display panel including a substrate including a first area, a second area, and a third area located between the first area and the second area; and a component including an electronic element located to correspond to the first area, in which the display panel includes: a display layer including a pixel circuit located in the second area and a display element electrically connected to the pixel circuit and including a pixel electrode, a counter electrode, and an intermediate layer located between the pixel electrode and the counter electrode; and a multi-layered film located in the third area and including a first metal layer, a second metal layer located on the first metal layer, and an organic insulating layer located between the first metal layer and the second metal layer, the first metal layer and the second metal layer contacting each other through at least one contact portion defined in the organic insulating layer, in which the multi-layered film includes at least one groove adjacent to the contact portion and defined in the multi-layered film, and at least one organic layer included in the intermediate layer is disconnected by the at least one groove.

According to an exemplary embodiment of the present disclosure, a display panel includes: a substrate including a component area where a component configured to add various functions is located, a display area where a plurality of pixels configured to display image are located, and an intermediate area located between the component area and the display area; a first metal layer located in the intermediate area and surrounding the component area; an organic insulating layer located on the first metal layer and including at least one contact portion surrounding the component area; a second metal layer located on the organic insulating layer and contacting the first metal layer through the at least one contact portion; and at least one groove located adjacent to the at least one contact portion, surrounding the component area, each having a first hole in the second metal layer and a second hole corresponding to the first hole in the organic insulating layer, and configured to disconnect any organic layer formed above the second metal layer.

The display panel may further include an inorganic insulating layer located between the first metal layer and the organic insulating layer.

BRIEF DESCRIPTION OF THE DRAWINGS

These and/or other aspects will become apparent and more readily appreciated from the following description of the exemplary embodiments, taken in conjunction with the accompanying drawings in which.

Figure 1:
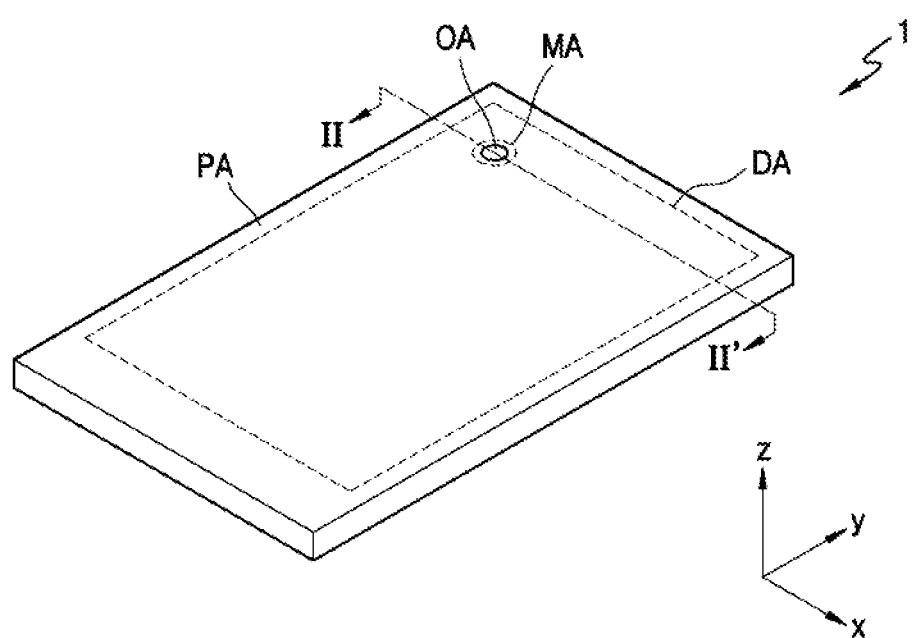
FIG. 1 is a perspective view of a display apparatus according to an exemplary embodiment of the present disclosure.

Since the drawings in FIGS. 1-17 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to exemplary embodiments of the present disclosure, examples of which are described herein and illustrated in the accompanying drawings, in which like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Expressions such as "at least one of" when preceding a list of elements, modify the entire list of elements and do not modify the individual elements of the list.

It will be understood that although the terms "first", "second", etc. may be used herein to describe various elements, these elements should not be limited by these terms, and the above terms are only used to distinguish one element from another.

As used herein, the singular forms "a", "an", and "the" are intended to include the plural forms as well, unless the context clearly indicates otherwise. Also, "About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be further understood that the terms "comprises" and/or "comprising" used herein specify the presence of stated features or components, but do not preclude the presence or addition of one or more other features or components.

It will be understood that when a layer, region, or element is referred to as being "formed on", another layer, region, or element, it may be directly formed on the other layer, region, or element, or intervening layers, regions, or elements may be present therebetween.

When a certain exemplary embodiment of the present disclosure may be implemented differently, a specific process order may be different from the described order. For example, two consecutively described processes may be performed substantially at the same time or performed in an order opposite to the described order.

As used herein, expressions such as "A and/or B" may include A, B, or A and B. Expressions such as "at least one of A and B may include A, B, or A and B.

It will be understood that when a layer, region, or element is referred to as being "connected", the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

FIG. 1 is a perspective view of a display apparatus 1 according to an exemplary embodiment of the present disclosure.

Referring to FIG. 1, the display apparatus 1 includes a first area OA and a display area DA that is a second area at least partially surrounding the first area OA. The display apparatus 1 may provide a predetermined image through light emitted from a plurality of pixels arranged in the display area DA. In an exemplary embodiment of the present disclosure, the plurality of pixels PX may be arranged in a matrix shape, but the present disclosure is not limited thereto. For example, the plurality of pixels PX may be arranged in a pentile matrix shape, or a diamond shape. The first area OA may be entirely surrounded by the display area DA. The first area OA may be an area where a component is located as described below with reference to FIG. 2A.

An intermediate area MA that is a third area may be located between the first area OA and the display area DA, and the display area DA may be surrounded by a peripheral area PA that is a fourth area. The intermediate area MA and the peripheral area PA may be non-display areas where pixels are not located. The intermediate area MA may be entirely surrounded by the display area DA, and the display area DA may be entirely surrounded by the peripheral area PA. The first area OA may be entirely surrounded by the intermediate area MA.

Although an organic light-emitting display apparatus will be described as the display apparatus 1 according to an exemplary embodiment of the present disclosure, the present disclosure is not limited thereto. In an exemplary embodiment of the present disclosure, the display apparatus 1 may be a display apparatus such as a quantum dot light-emitting display apparatus. A light emitting layer of the organic light-emitting display apparatus may include an organic light-emitting material. A light emitting layer of the quantum dot light-emitting display apparatus may include a quantum dot and/or a quantum rod.

Although one first area OA substantially having a circular shape is provided in FIG. 1, the present disclosure is not limited thereto. The number of first areas OA may be equal to or greater than 2, and a shape of each first area OA may be modified in various ways such as, for example, a circular shape, an elliptical shape, a polygonal shape, a star shape, or a diamond shape. When two or more first areas OA are provided, the first areas OA may have the same shape or different shapes.

Figure 2A:
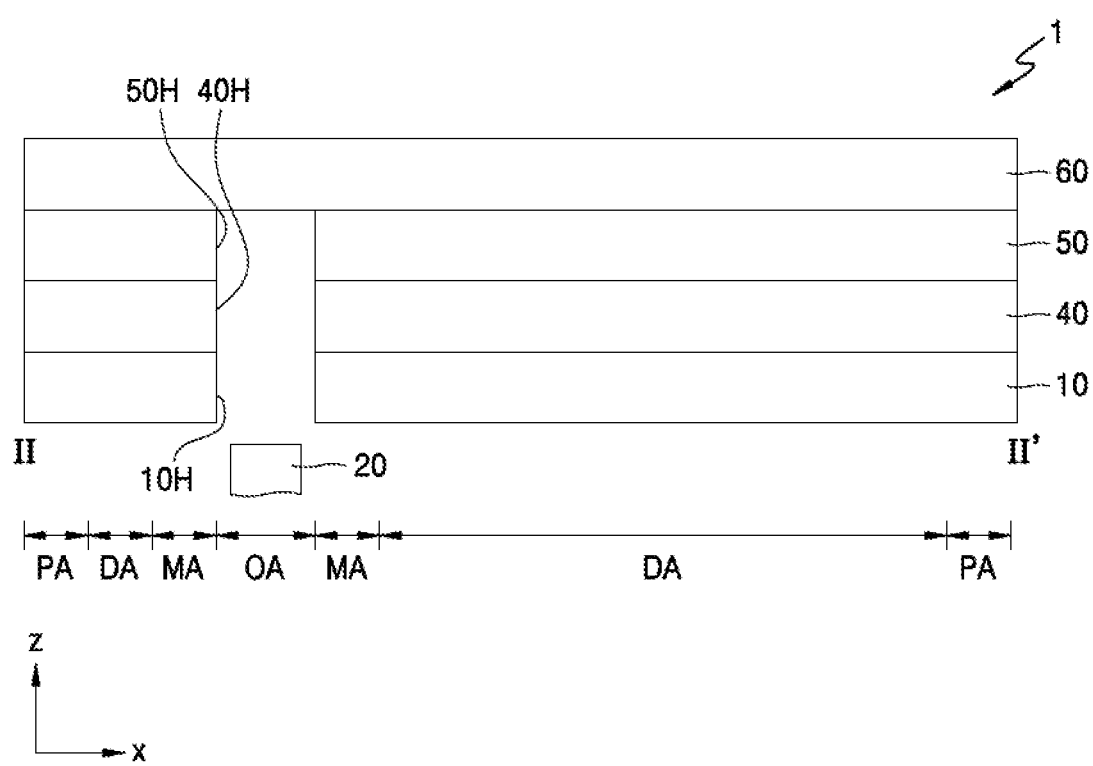
FIGS. 2A and 2B are cross-sectional views of the display apparatus according to an exemplary embodiment of the present disclosure.
Figure 2B:
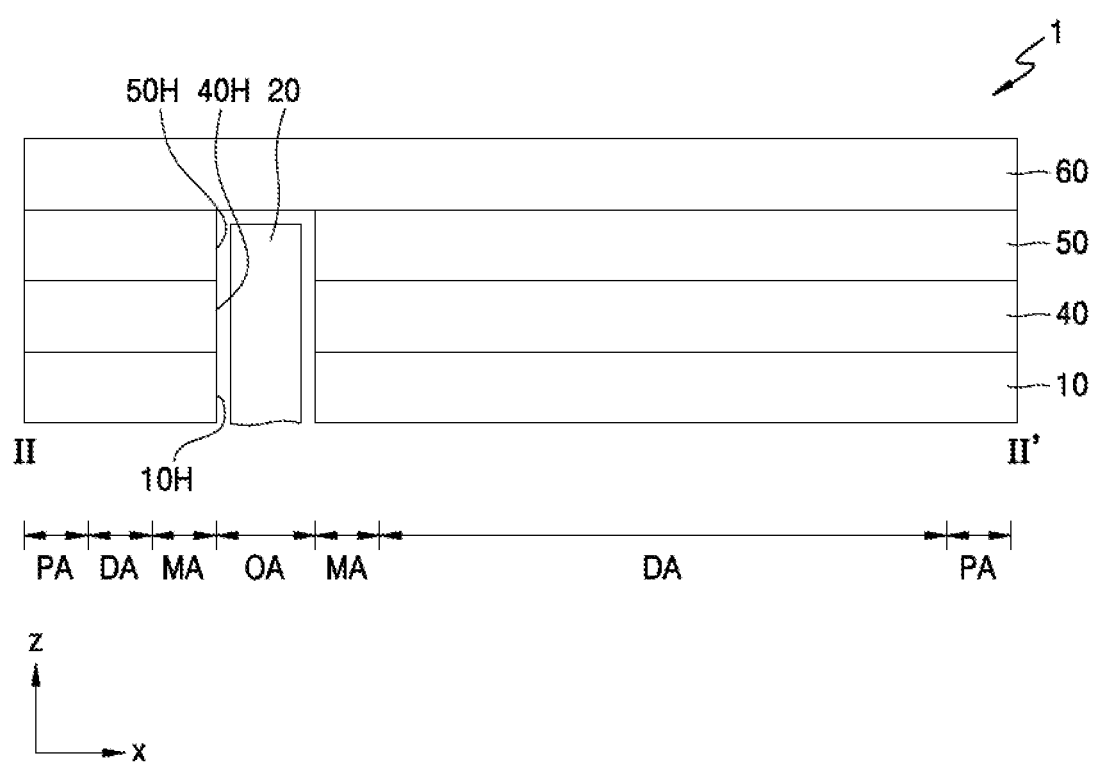
Figure 3:
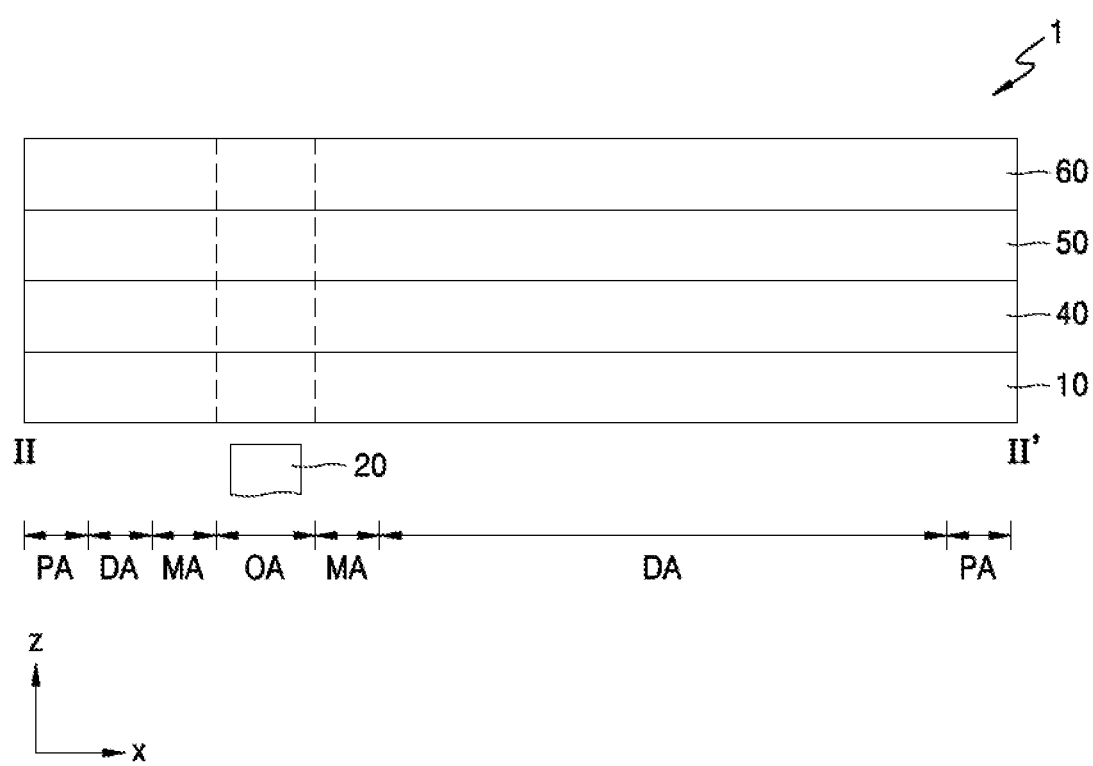
FIG. 3 is a cross-sectional view of the display apparatus according to an exemplary embodiment of the present disclosure.

FIGS. 2A, 2B, and 3 are cross-sectional views of the display apparatus 1 according to an exemplary embodiment of the present disclosure, taken along line II-II' of FIG. 1.

Referring to FIG. 2A, the display apparatus 1 may include a display panel 10, an input sensing layer 40 located on the display panel 10, and an optical functional layer 50 located on the input sensing layer 40, and the display panel 10, the input sensing layer 40, and the optical functional layer 50 may be covered by a window 60. The display apparatus 1 may be any of various electronic devices such as, for example, a mobile phone, a notebook, or a smart watch.

The display panel 10 may display an image. The display panel 10 includes pixels arranged in the display area DA. The pixels may include a display element and a pixel circuit connected to the display element. The display element may include, for example, an organic light-emitting diode (OLED) or a quantum dot light-emitting diode QD-LED. Alternatively, the display element may include, for example, an electrophoretic element, or an electrowetting element.

The input sensing layer 40 obtains coordinate information according to an external input, for example, a touch event. The input sensing layer 40 may include a sensing electrode (or a touch electrode) and trace lines connected to the sensing electrode. The input sensing layer 40 may be located on the display panel 10. The input sensing layer 40 may detect an external input by using a mutual capacitance method and/or a self-capacitance method. For example, the input sensing layer 40 may obtain information on the external input through a change in capacitance between two sensing electrodes.

The input sensing layer 40 may be directly formed on the display panel 10, or may be separately formed and then may be coupled to the display panel 10 via an adhesive layer such as an optically clear adhesive (OCA). For example, the input sensing layer 40 may be continuously formed after a process of forming the display panel 10, and in this case, the input sensing layer 40 may be a part of the display panel 10 and an adhesive layer may not be located between the input sensing layer 40 and the display panel 10. For example, the input sensing layer 40 and the display panel 10 may be integrated in a single base substrate within the display apparatus 1. Thus, the thickness of the display apparatus 1 may be reduced. Although the input sensing layer 40 is located between the display panel 10 and the optical functional layer 50 as shown in FIG. 2A, the present disclosure is not limited thereto. For example, in an exemplary embodiment of the present disclosure, the input sensing layer 40 may be located over the optical functional layer 50.

The optical functional layer 50 may include an anti-reflection layer. The anti-reflection layer may reduce a reflectance of light (external light) incident on the display panel 10 through the window 60. The anti-reflection layer may include a phase retarder and a polarizer. The phase retarder may be of a film type or a liquid crystal coating type and may include a λ/2 phase retarder and/or a λ/4 phase retarder. The polarizer may also be of a film type or liquid crystal coating type. The polarizer of the film type may include an elongated synthetic resin film, and the polarizer of the liquid crystal coating type may include liquid crystals arranged with a predetermined orientation. For example, when both the polarizer and the phase retarder are the film type, a λ/4 phase retarder film (or a λ/2 phase retarder film) may be bonded and laminated onto one surface of the polarizer through an OCA layer. The phase retarder and the polarizer may further include a transparent protective film. The phase retarder and the polarizer or the transparent protective film may be defined as a base layer of the anti-reflection layer.

In an exemplary embodiment of the present disclosure, the anti-reflection layer may include a black matrix and color filters. The color filters may be arranged considering a color of light emitted by each of the pixels of the display panel 10. Thus, the desired color may be realized by filtering the light emitted by each of the pixels with the color filter. In an exemplary embodiment of the present disclosure, the anti-reflection layer may include a destructive interference structure. The destructive interference structure may include a first reflective layer and a second reflective layer located on different layers. First reflected light and second reflected light respectively reflected by the first reflective layer and the second reflective layer may be destructively interfered with each other, thereby reducing a reflectance of external light.

The optical functional layer 50 may include a lens layer. The lens layer may enhance light extraction efficiency of light emitted by the display panel 10 or may reduce color deviation. The lens layer may include a layer having a concave or convex lens shape, and/or may include a plurality of layers having different refractive indices. In an exemplary embodiment of the present disclosure, an array of lenses of the lens layer may cover an array of pixels, in which at least one of the lenses may cover at least one of the pixels. The optical functional layer 50 may include both the anti-reflection layer and the lens layer, or may include any one of the anti-reflection layer and the lens layer.

In an exemplary embodiment of the present disclosure, the optical functional layer 50 may be continuously formed after a process of forming the display panel 10 and/or the input sensing layer 40. In this case, an adhesive layer such as an OCA layer may not be located between the optical functional layer 50 and the display panel 10 and/or the input sensing layer 40.

The display panel 10, the input sensing layer 40, and/or the optical functional layer 50 may have openings. In this regard, in FIG. 2A, the display panel 10, the input sensing layer 40, and the optical functional layer 50 respectively have first through third openings 10H, 40H, and 50H, and the first through third openings 10H, 40H, and 50H overlap one another. The first through third openings 10H, 40H, and 50H are formed to correspond to the first area OA.

In an exemplary embodiment of the present disclosure, at least one of the display panel 10, the input sensing layer 40, and the optical functional layer 50 may not have an opening. For example, one or two selected from among the display panel 10, the input sensing layer 40, and the optical functional layer 50 may not have an opening. Alternatively, the display panel 10, the input sensing layer 40, and the optical functional layer 50 may not have an opening as shown in FIG. 3.

The first area OA may be a component area (e.g., a sensor area, a camera area, or a speaker area) where a component 20 for adding various functions is located as described above. The component 20 may be located to correspond to the first through third openings 10H, 40H, and 50H and may be located under the display panel 10 as shown in FIG. 2A. Alternatively, the component 20 may be located so that at least a part of the component 20 is inserted into the first through third openings 10H, 40H, and 50H, as shown in FIG. 2B. The component 20 may be disposed to overlap the first through third openings 10H, 40H, and 50H. Accordingly, since the component 20 is assembled to overlap the first through third openings 10H, 40H, and 50H in a plan view, it may easily communicate with the outside through the first through third openings 10H, 40H, and 50H. Alternatively, the component 20 may be located under the display panel 10 not having a through-hole, as shown in FIG. 3.

The component 20 may include an electronic element located to correspond to the first area OA. For example, the component 20 may include an electronic element using light or sound. Examples of the electronic element may include a sensor for outputting and/or receiving light such as an infrared sensor, a camera for receiving light and capturing an image, a sensor for outputting and detecting light or sound to measure a distance or recognize a fingerprint, a small lamp for outputting light, and a speaker for outputting sound. When the component 20 is an electronic element using light, the component 20 may use light of various wavelength bands such as visible light, infrared light, or ultraviolet light. In an exemplary embodiment of the present disclosure, the first area OA may be a transmission area through which light and/or sound output from the component 20 to the outside or traveling from the outside toward the electronic element may be transmitted. For example, the component 20 may include at least one of a camera, a speaker, a lamp, a light detection sensor, and a thermal detection sensor. The component 20 may detect an external object received through the first area OA or provide a sound signal such as voice to the outside through the first area OA. In addition, the component 20 may include a plurality of configurations, and is not limited to any one exemplary embodiment.

In an exemplary embodiment of the present disclosure, when the display apparatus 1 is used as a smart watch or a vehicle instrument panel, the component 20 may be a member such as a clock hand or a needle indicating predetermined information (e.g., a vehicle speed). When the display apparatus 1 includes a clock hand or a vehicle instrument panel, the component 20 may pass through the window 60 and may be exposed to the outside, and the window 60 may have an opening corresponding to the first area OA.

The component 20 may include an element (or elements) related to a function of the display panel 10 as described above, or may include an element such as an accessory for enhancing the beauty of the display panel 10. Since the window 60 may be separately formed from the optical functional layer 50, a layer including an OCA may be located between the window 60 and the optical functional layer 50.

FIGS. 4A through 4D are cross-sectional views of the display panel 10 according to an exemplary embodiment of the present disclosure.

Figure 4A:
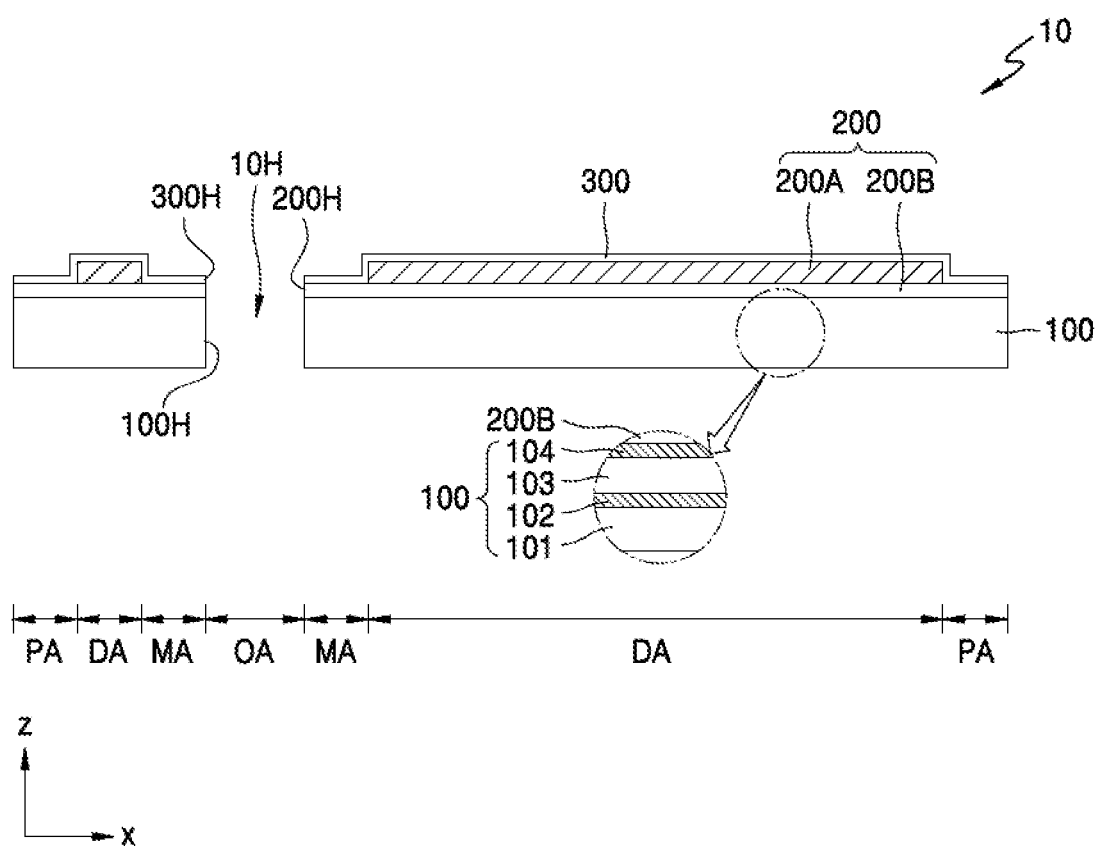
FIGS. 4A through 4D are cross-sectional views of a display panel according to an exemplary embodiment of the present disclosure.

Referring to FIG. 4A, the display panel 10 includes a display layer 200 located on a substrate 100. The substrate 100 may include, for example, a glass material and/or a polymer resin, and may have a multi-layer structure. For example, the substrate 100 may include a first base layer 101, a first barrier layer 102, a second base layer 103, and a second barrier layer 104, as shown in an enlarged view of FIG. 4A.

Each of the first base layer 101 and the second base layer 103 may include a polymer resin. For example, each of the first base layer 101 and the second base layer 103 may include a polymer resin such as, for example, polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose-triacetate (TAC), or cellulose acetate propionate (CAP). The polymer resin may be transparent, and may be provided such that at least a part of the display panel 10 may be easily bent. Alternatively, the substrate 100 may be provided in a rigid state.

Each of the first barrier layer 102 and the second barrier layer 104 that is a barrier layer for preventing penetration of external foreign materials may have a single or multi-layer structure including an inorganic material such as, for example, silicon nitride (SiNx) or silicon oxide (SiOx). For example, first barrier layer 102 and the second barrier layer 104 may include an inorganic material to prevent oxygen or water flowing through the substrate 100 from penetrating the display layer 200.

The display layer 200 includes a plurality of pixels. The display layer 200 may include a display element layer 200A including display elements respectively located in the display area DA for pixels, and a pixel circuit layer 200B including insulating layers and pixel circuits located in the display area DA for pixels. The display elements may be electrically connected to the pixel circuits. The display element layer 200A may include a pixel electrode, a counter electrode, and a stacked structure located between the pixel electrode and the counter electrode, and each of the display elements may include an OLED. Each of the pixel circuits may include a thin-film transistor (TFT) and a storage capacitor.

The display elements of the display layer 200 may be covered by an encapsulation member such as a thin-film encapsulation layer 300, and the thin-film encapsulation layer 300 may include at least one inorganic encapsulation layer and at least one organic encapsulation layer. When the display panel 10 includes the substrate 100 including a polymer resin and the thin-film encapsulation layer 300 including an inorganic encapsulation layer and an organic encapsulation layer, the flexibility of the display panel 10 may be enhanced. In addition, in the case of forming a flexible display device, a plastic film that has excellent ductility may be used to form the window 60 besides the substrate 100 including a polymer resin.

The display panel 10 may have the first opening 10H passing through the display panel 10. The first opening 10H may be located in the first area OA, and in this case, the first area OA may be an opening area. In FIG. 4A, the substrate 100 and the thin-film encapsulation layer 300 respectively have through-holes 100H and 300H corresponding to the first opening 10H of the display panel 10. The display layer 200 may also have a through-hole 200H corresponding to the first area OA.

Figure 4B:
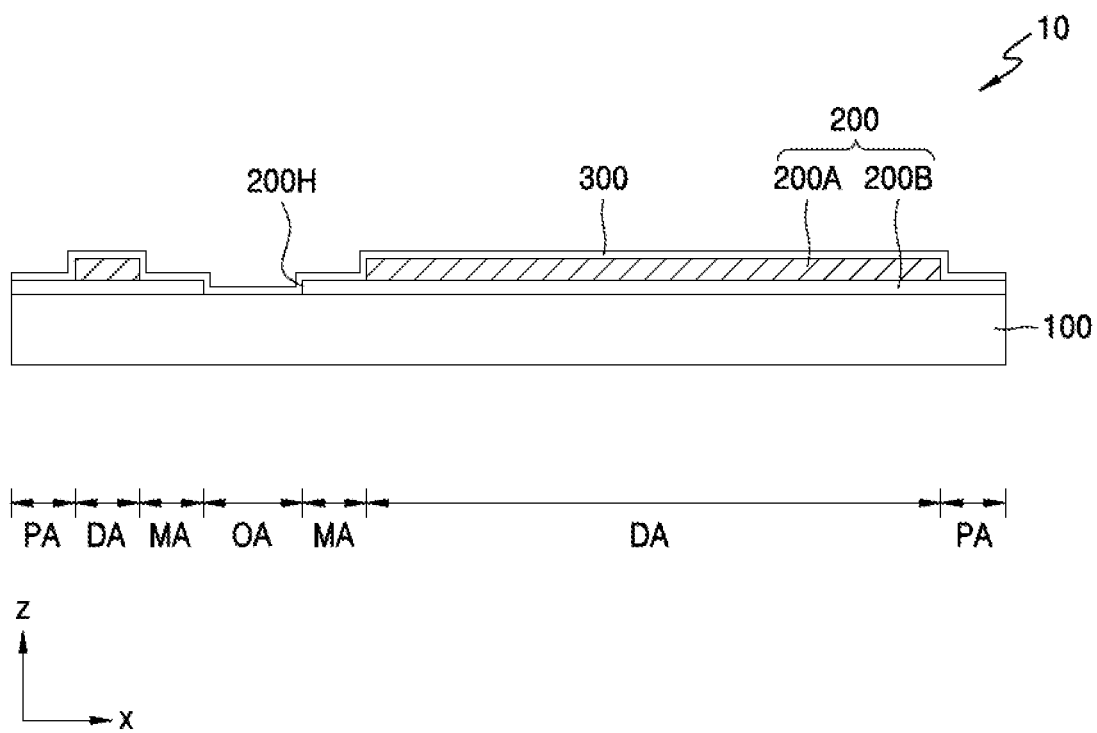
Figure 4C:
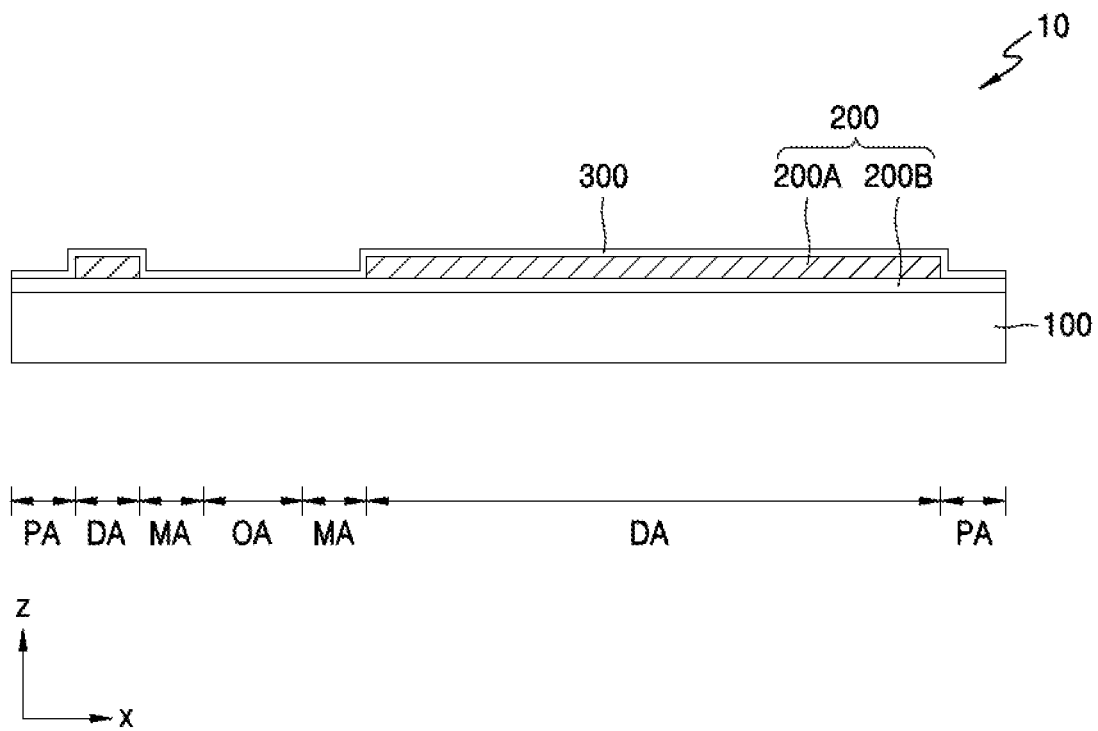

In an exemplary embodiment of the present disclosure, as shown in FIG. 4B, the substrate 100 may not have a through-hole corresponding to the first area OA. The display layer 200 may have the through-hole 200H corresponding to the first area OA. The thin-film encapsulation layer 300 may not have a through-hole corresponding to the first area OA. In an exemplary embodiment of the present disclosure, as shown in FIG. 4C, the display layer 200 may not have the through-hole 200H corresponding to the first area OA. Also, the substrate 100 may not have a through-hole corresponding to the first area OA, and the thin-film encapsulation layer 300 may not have a through-hole corresponding to the first area OA.

Figure 4D:
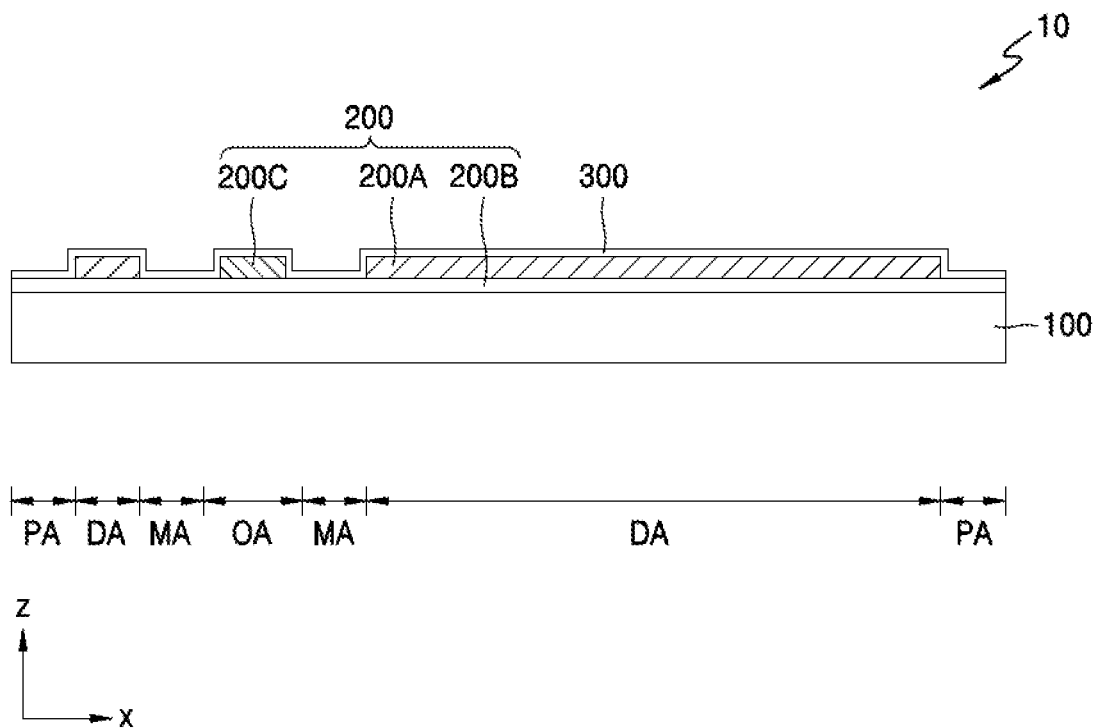

Although the display element layer 200A is not located in the first area OA in FIGS. 4A through 4C, the present disclosure is not limited thereto. For example, in an exemplary embodiment of the present disclosure, an auxiliary display element layer 200C may be located in the first area OA, as shown in FIG. 4D. The auxiliary display element layer 200C may include a display element having a structure and/or an operation method different from those of a display element of the display element layer 200A.

In an exemplary embodiment of the present disclosure, each pixel of the display element layer 200A may include an active-matrix OLED, and each pixel of the auxiliary display element layer 200C may include a passive-matrix OLED. When the auxiliary display element layer 200C includes a display element of a passive-matrix OLED, elements constituting a pixel circuit may not be under the passive-matrix OLED. For example, a portion of the pixel circuit layer 200B under the auxiliary display element layer 200C does not include a transistor and a storage capacitor. Thus, the auxiliary display element layer 200C including a passive-matrix OLED uses a simple control scheme and is controlled by an external circuit.

In an exemplary embodiment of the present disclosure, the auxiliary display element layer 200C may include a display element of the same type (e.g., an active-matrix OLED) as that of the display element layer 200A, and a structure of a pixel circuit located under the auxiliary display element layer 200C may be different from that under the display element layer 200A. For example, a pixel circuit (e.g., a pixel circuit including a shield film located between the substrate 100 and a transistor) located under the auxiliary display element layer 200C may have a structure different from that of a pixel circuit located under the display element layer 200A. Alternatively, display elements of the auxiliary display element layer 200C and display elements of the display element layer 200A may operate according to different control signals. For example, the display elements of the auxiliary display element layer 200C may provide a function different from that of the display elements of the display element layer 200A. A component (e.g., an infrared sensor) that does not require a relatively high transmittance may be located in the first area OA where the auxiliary display element layer 200C is located. In this case, the first area OA may be a component area or an auxiliary display area.

Figure 5:
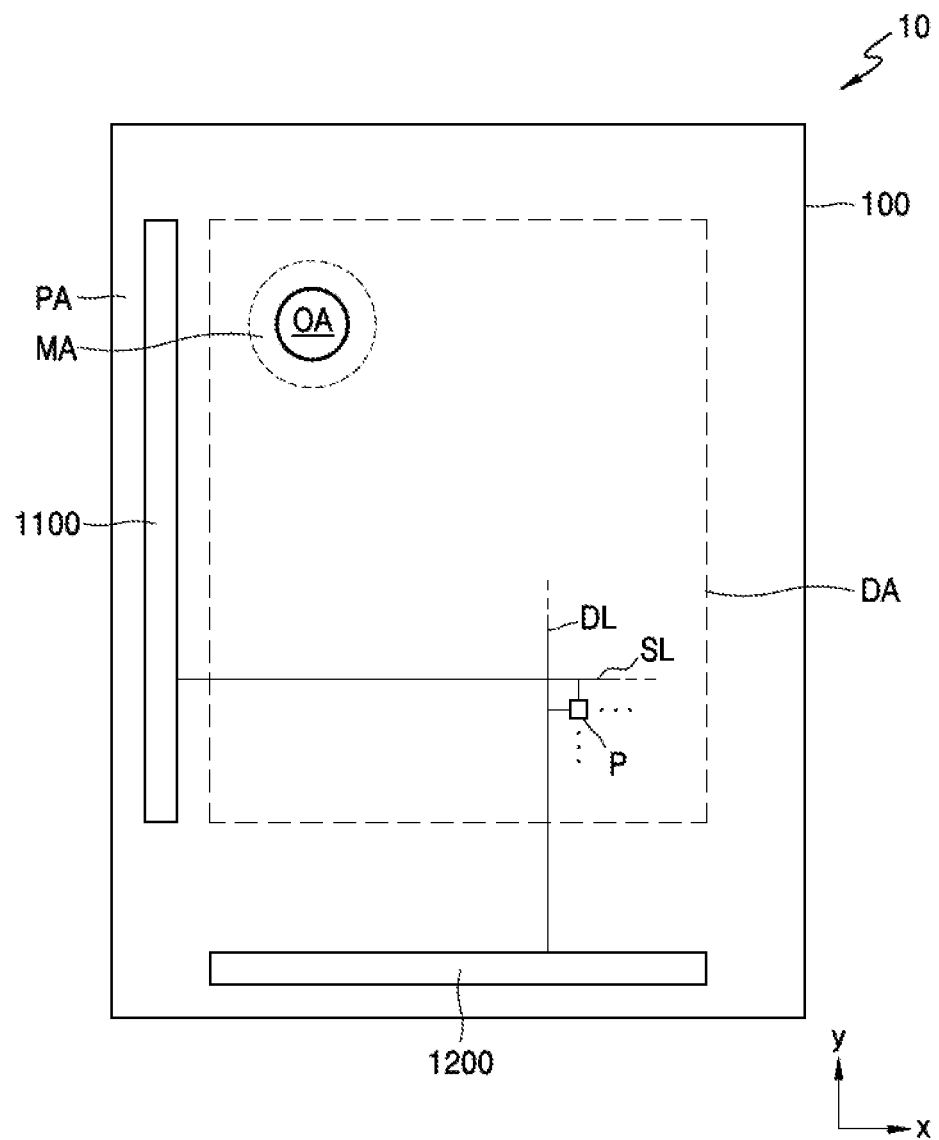
FIG. 5 is a plan view of the display panel according to an exemplary embodiment of the present disclosure.
Figure 6:
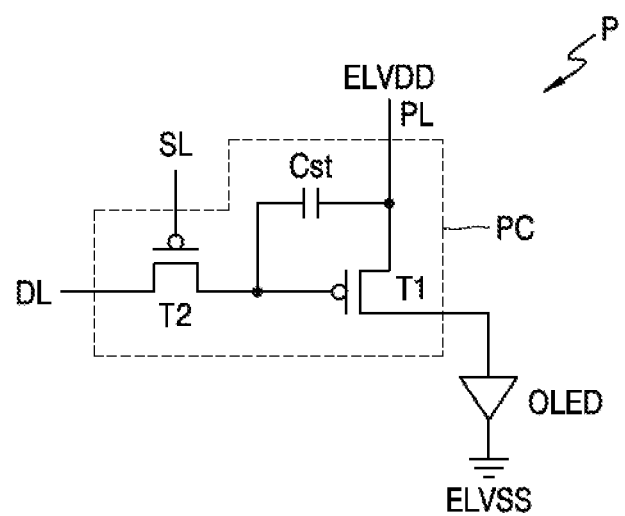
FIG. 6 is an equivalent circuit diagram illustrating a pixel of the display panel according to an exemplary embodiment of the present disclosure.

FIG. 5 is a plan view of the display panel 10 according to an exemplary embodiment of the present disclosure, and FIG. 6 is an equivalent circuit diagram illustrating a pixel P of the display panel 10 according to an exemplary embodiment of the present disclosure.

Referring to FIG. 5, the display panel 10 may include the first area OA, the display area DA that is a second area, the intermediate area MA that is a third area, and the peripheral area PA that is a fourth area. FIG. 5 may illustrate the substrate 100 of the display panel 10. For example, the substrate 100 may be understood as including the first area OA, the display area DA, the intermediate area MA, and the peripheral area PA.

The display panel 10 includes a plurality of pixels P arranged in the display area DA. Each of the pixels P includes a pixel circuit PC and an OLED that is a display element connected to the pixel circuit PC, as shown in FIG.

6. The pixel circuit PC may include a first TFT T1, a second TFT T2, and a storage capacitor Cst. Each pixel P may emit, for example, red, green, blue, or white light, through the OLED. The display panel 10 may display a predetermined image through light emitted from the plurality of pixels arranged in the display area DA according to an electrical signal.

The second TFT T2, that is a switching TFT for controlling turn-on and turn-off of the pixel P, may be connected to a scan line SL and a data line DL and may transmit a data voltage input from the data line DL to the first TFT T1 based on a switching voltage input from the scan line SL. The storage capacitor Cst may be connected to the second TFT T2 and a driving voltage line PL and may store a voltage corresponding to a difference between a voltage received from the second TFT T2 and a first power supply voltage ELVDD supplied to the driving voltage line PL.

The first TFT T1 that is a driving TFT may be connected to the driving voltage line PL and the storage capacitor Cst and may control driving current flowing from the driving voltage line PL to the OLED in response to the voltage stored in the storage capacitor Cst. The OLED may emit light having a predetermined luminance according to the driving current. The turn-on time of the first TFT T1 may be determined according to the amount of voltage stored in the storage capacitor Cst. The first TFT T1 may then provide to the OLED the first power supply voltage ELVDD transmitted through the driving voltage line PL during the turn-on time. A counter electrode (e.g., a cathode) of the OLED may receive a second power supply voltage ELVSS.

Although the pixel circuit PC includes two TFTs and one storage capacitor in FIG. 6, the present disclosure is not limited thereto. The number of TFTs and the number of storage capacitors may be changed in various ways according to a design of the pixel circuit PC. For example, the pixel circuit PC may include three, four, five, or more TFTs instead of the above two TFTs.

Referring back to FIG. 5, the intermediate area MA may surround the first area OA in a plan view. The intermediate area MA is an area where a display element such as an OLED for emitting light is not located, and signal lines for applying signals to the pixels P arranged around the first area OA may pass through the intermediate area MA. A scan driver 1100 for applying a scan signal to each pixel P, a data driver 1200 for applying a data signal to each pixel P, and main power supply wirings for supplying a first power supply voltage ELVDD and a second power supply voltage ELVSS may be located in the peripheral area PA. Although the data driver 1200 is located adjacent to a side of the substrate 100 in FIG. 5, the present disclosure is not limited thereto. For example, in an exemplary embodiment of the present disclosure, the data driver 1200 may be located on a flexible printed circuit board (FPCB) electrically connected to a pad located at a side of the display panel 10. The FPCB may be bent and electrically connected to the display panel 10. Accordingly, the FPCB may output a signal to the display panel 10 or receive a signal from the display panel 10.

Figure 7:
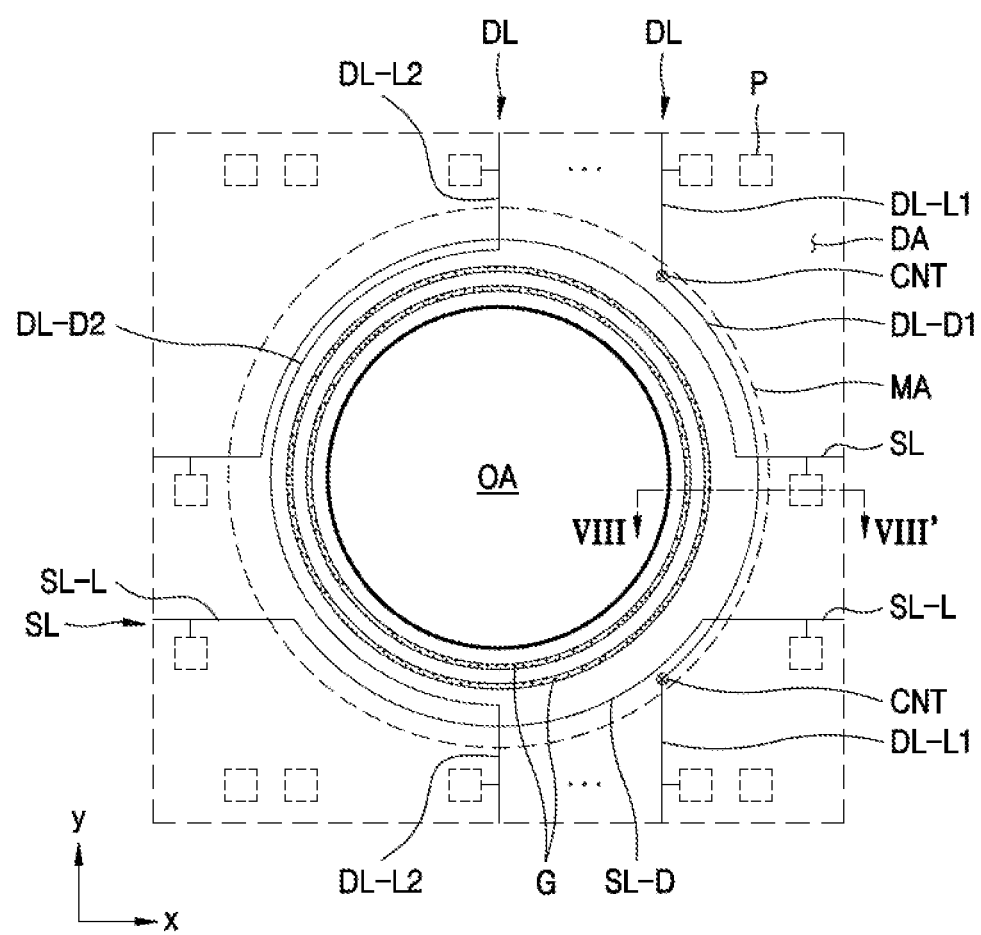
FIG. 7 is a plan view illustrating a part of the display panel according to an exemplary embodiment of the present disclosure.

FIG. 7 is a plan view illustrating a part of the display panel 10 according to an exemplary embodiment of the present disclosure.

Referring to FIG. 7, the pixels P are located in the display area DA around the first area OA. Some pixels P may be spaced apart from one another around the first area OA, and the first area OA may be defined between the pixels P. For example, in the plan view, the pixels P may be located above and below the first area OA and may be located at the left and the right of the first area OA. Since the intermediate area MA is an area where the pixels P are not located, in the plan view, the pixels P may be located above and below the intermediate area MA and may be located at the left and the right of the intermediate area MA.

Signal lines adjacent to the first area OA, from among signal lines that apply signals to the pixels P, may bypass the first area OA. In the plan view of FIG. 7, at least one data line DL from among data lines passing through the display area DA may extend in a y-direction to apply a data signal to the pixels P located above and below the first area OA, and may bypass along an edge of the first area OA in the intermediate area MA. In the plan view, at least one scan line SL from among scan lines passing through the display area DA may extend in an x-direction to apply a scan signal to the pixels P located at the left and the right of the first area OA and may bypass along an edge of the first area OA in the intermediate area MA. For example, the scan line SL of the right side and the scan line SL of the left side may be connected to each other through a bypassing portion SL-D and an extending portion SL-L, with the bypassing portion SL-D of the scan line SL disposed within the intermediate area MA and circumventing the first area OA.

The bypassing portion SL-D of the scan line SL and the extending portion SL-L of the scan line SL crossing the display area DA may be located on the same layer and may be integrally formed. A bypassing portion DL-D1 of at least one data line DL from among the data lines DL and an extending portion DL-L1 of the data line DL crossing the display area DA may be formed on different layers, and the bypassing portion DL-D1 and the extending portion DL-L1 of the data line DL may be connected to each other through a contact hole CNT. A bypassing portion DL-D2 of at least one data line DL from among the data lines DL and an extending portion DL-L2 of the data line DL may be located on the same layer and may be integrally formed.

One or more grooves G may be located between the first area OA and a portion of the intermediate area MA, where the scan lines SL and the data lines DL bypass. In the plan view, each of the grooves G may have a ring shape surrounding the first area OA, and the grooves G may be apart from one another. The bypassing portion SL-D of the scan line SL and the bypassing portions DL-D1 and DL-D2 of the data line DL may be disposed between the grooves G and the display area DA.

Figure 8:
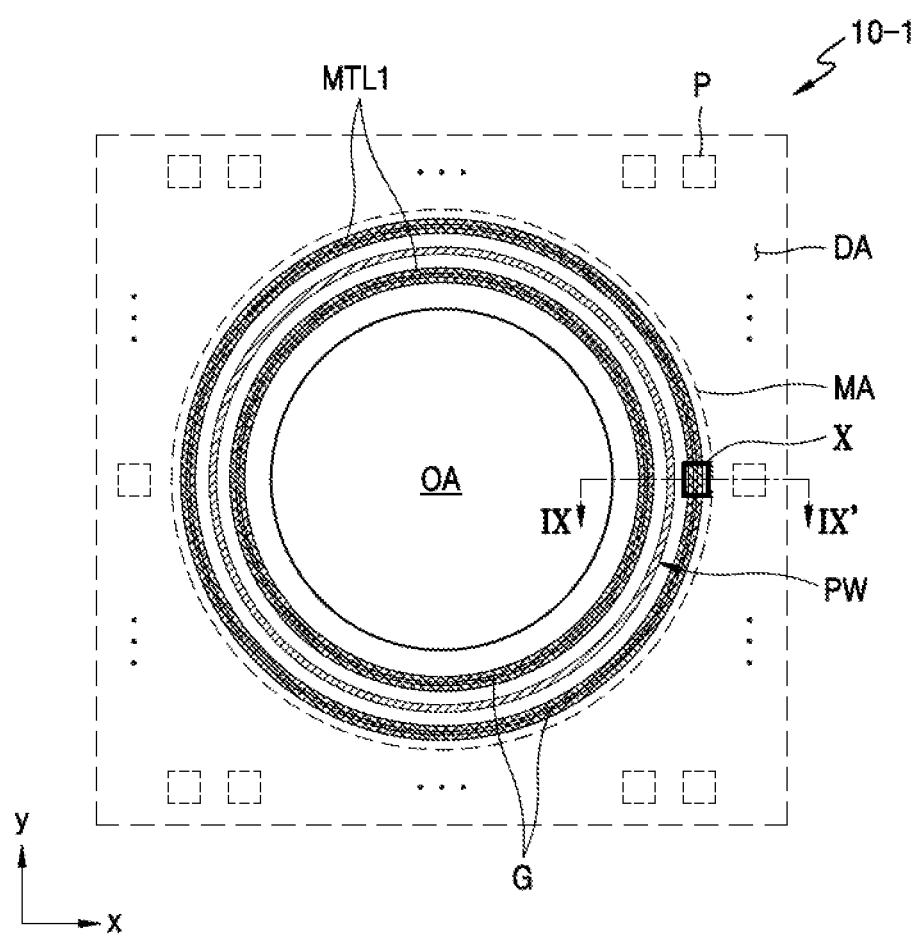
FIG. 8 is a plan view illustrating a part of a display panel according to an exemplary embodiment of the present disclosure.
Figure 9:
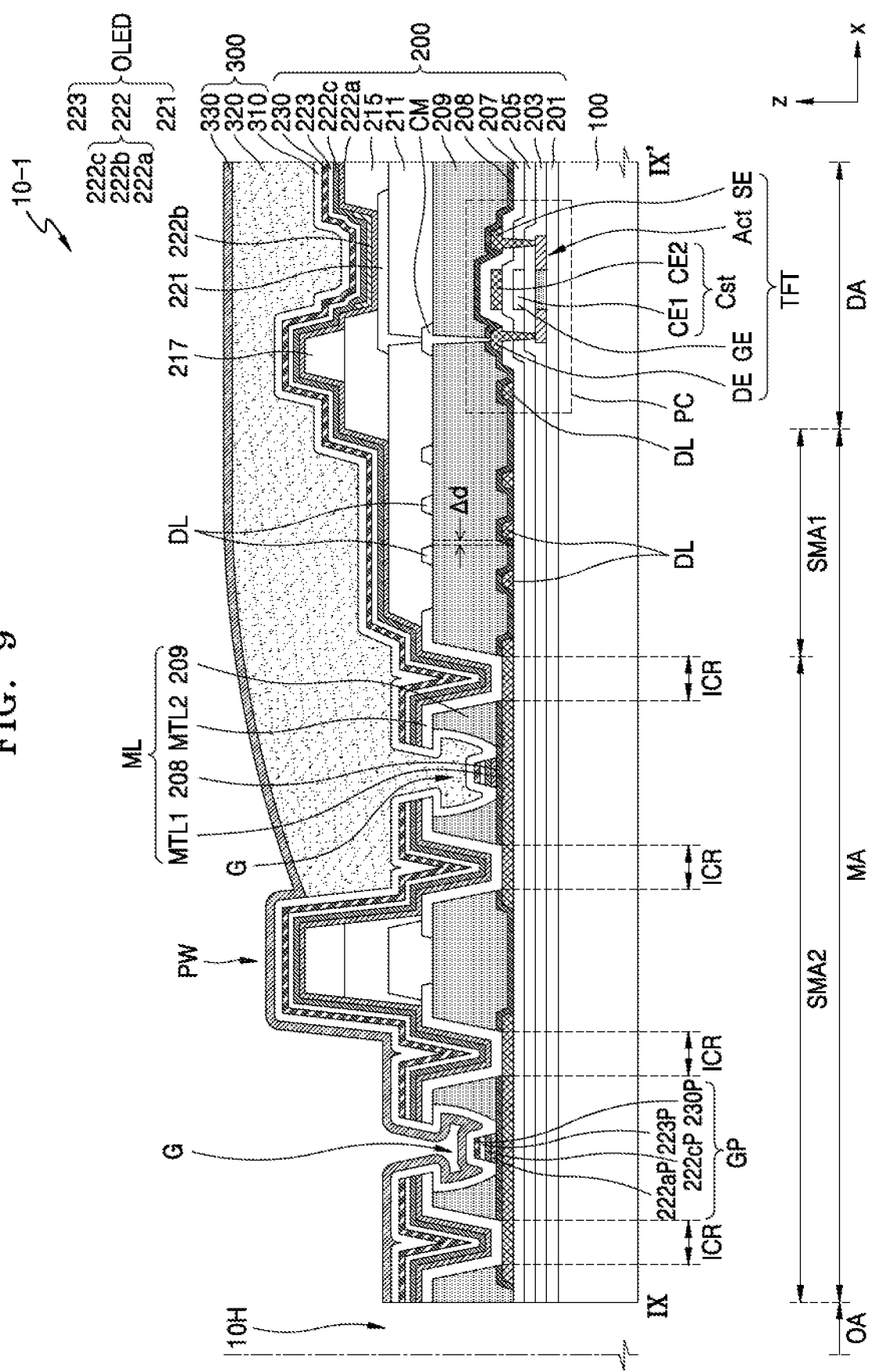
FIG. 9 is a cross-sectional view of the display panel according to an exemplary embodiment of the present disclosure.
Figure 10A:
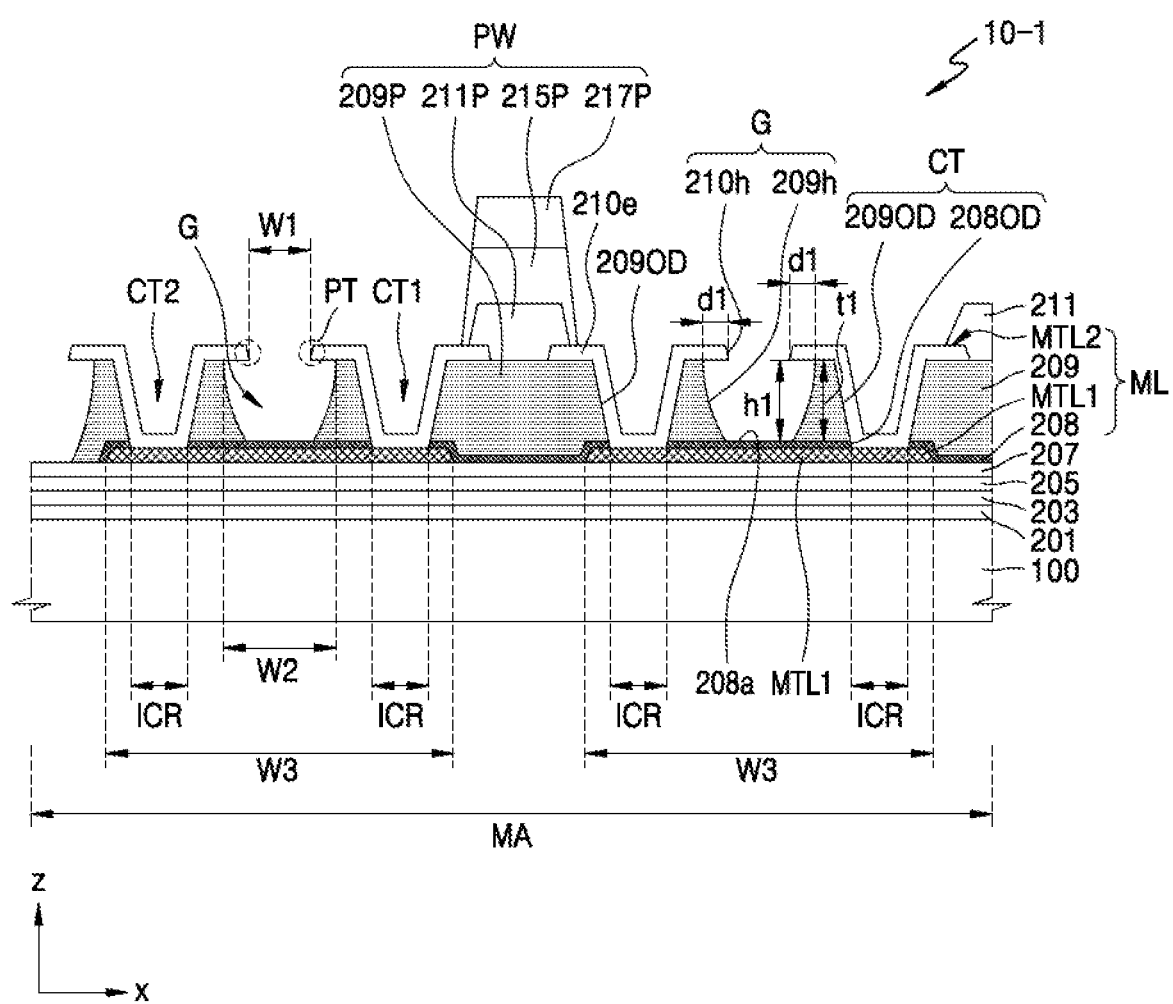
FIGS. 10A through 10C are cross-sectional views and a plan view of a manufacturing process of the display panel according to an exemplary embodiment of the present disclosure.

FIG. 8 is a plan view of a display panel 10-1 according to an exemplary embodiment of the present disclosure, and FIG. 9 is a cross-sectional view of the display panel 10-1 according to an exemplary embodiment of the present disclosure, taken along line IX-IX' of FIG. 8. Also, FIGS. 10A through 10O are cross-sectional views and a plan view of a manufacturing process of the display panel 10-1 according to an exemplary embodiment of the present disclosure, illustrating the intermediate area MA.

Referring to FIG. 8, a partition wall PW and at least one groove G surrounding the first area OA may be provided in the intermediate area MA. The partition wall PW may have a ring shape surrounding the first area OA.

In an exemplary embodiment of the present disclosure, a plurality of the grooves G may be provided and may be located at both sides of the partition wall PW. In FIG. 8, at least one of the grooves G may be provided outside the partition wall PW and adjacent to the display area DA, and others of the grooves G may be provided inside the partition wall PW and adjacent to the first area OA. In an exemplary embodiment of the present disclosure, two or more grooves G may be provided inside the partition wall PW and adjacent to the first area OA.

First metal layers MTL1 may be located to overlap the grooves G in the intermediate area MA. Although the first metal layers MTL1 overlap all of the grooves G in FIG. 8, the present disclosure is not limited thereto. For example, in an exemplary embodiment of the present disclosure, the first metal layers MTL1 may overlap some of the grooves G. Thus, the first metal layers MTL1 may not be located under some of the grooves G. Each of the first metal layers MTL1 may have a ring shape surrounding the first area OA.

Referring to the display area DA of FIG. 9, the substrate 100 may include, for example, a glass material or a polymer resin. In an exemplary embodiment of the present disclosure, the substrate 100 may include a plurality of sub-layers as shown in an enlarged view of FIG. 4A.

A buffer layer 201 for preventing penetration of impurities into a semiconductor layer Act of a TFT may be formed on the substrate 100. The buffer layer 201 may include an inorganic insulating material, such as, for example, $SiN_x$, silicon oxynitride (SiON), or $SiO_x$, and may have a single or multi-layer structure including the inorganic insulating material.

The pixel circuit PC may be located on the buffer layer 201. The pixel circuit PC includes the TFT and the storage capacitor Cst. The TFT may include the semiconductor layer Act, a gate electrode GE, and a source electrode SE and a drain electrode DE that are connection electrodes. The gate electrode GE may overlap the semiconductor layer Act. The portion of the semiconductor layer Act overlapping the gate electrode may be the channel region of the TFT. The TFT of FIG. 9 may correspond to a driving TFT described with reference to FIG. 6. The data line DL may be electrically connected to a switching TFT included in the pixel circuit PC. Although the TFT is a top-gate TFT in which the gate electrode GE is located over the semiconductor layer Act with a gate insulating layer 203 located therebetween as shown in the present exemplary embodiment, the present disclosure is not limited thereto. For example, in an exemplary embodiment of the present disclosure, the TFT may be a bottom-gate TFT.

The semiconductor layer Act may include polysilicon. Alternatively, the semiconductor layer Act may include, for example, amorphous silicon, an oxide semiconductor, or an organic semiconductor. The gate electrode GE may include a low resistance metal material. The gate electrode GE may include a conductive material including, for example, silver (Ag), molybdenum (Mo), aluminum (Al), copper (Cu), chromium (Cr), nickel (Ni), titanium (Ti), or an alloy thereof, and may have a single or multi-layer structure including the conductive material.

The gate insulating layer 203 between the semiconductor layer Act and the gate electrode GE may include an inorganic insulating material such as, for example, $SiO_x$, $SiN_x$, SiON, aluminum oxide ($Al_2O_3$), titanium oxide ($TiO_2$), tantalum oxide ($Ta_2O_5$), lanthanum oxide ($La_2O_3$), zirconium oxide ($ZrO_2$), or hafnium oxide ($HfO_2$). The gate insulating layer 203 may have a single or multi-layer structure including the inorganic insulating material.

The source electrode SE and the drain electrode DE that are connection electrodes electrically connected to the semiconductor layer Act may be located on a layer the same as that of the data line DL, and may include a material the same as that of the data line DL. The portion of the semiconductor layer Act connected to the source electrode SE or the drain electrode DE may be doped with an n-type dopant or a p-type dopant. Each of the source electrode SE, the drain electrode DE, and the data line DL may include a material having high conductivity. Each of the source electrode SE and the drain electrode DE may include a conductive material including, for example, silver (Ag), molybdenum (Mo), aluminum (Al), copper (Cu), chromium (Cr), nickel (Ni), titanium (Ti), or an alloy thereof, and may have a single or multi-layer structure including the conductive material. In an exemplary embodiment of the present disclosure, each of the source electrode SE, the drain electrode DE, and the data line DL may have a multi-layer structure formed of Ti/Al/Ti.

The storage capacitor Cst may include a lower electrode CE1 and an upper electrode CE2 overlapping each other with a first interlayer insulating layer 205 disposed therebetween. The storage capacitor Cst may overlap the TFT. In this regard, in FIG. 9, the gate electrode GE of the TFT is the lower electrode CE1 of the storage capacitor Cst. In an exemplary embodiment of the present disclosure, the storage capacitor Cst may not overlap the TFT. The storage capacitor Cst may be covered by a second interlayer insulating layer 207. The upper electrode CE2 of the storage capacitor Cst may include a conductive material including, for example, Ag, Mo, Al, Cu, Cr, Ni, Ti, or an alloy thereof, and may have a single or multi-layer structure including the conductive material.

Each of the first interlayer insulating layer 205 and the second interlayer insulating layer 207 may include an inorganic insulating material such as, for example, $SiO_x$, $SiN_x$, SiON, $Al_2O_3$, $TiO_2$, $Ta_2O_5$, or $HfO_2$. Each of the first interlayer insulating layer 205 and the second interlayer insulating layer 207 may have a single or multi-layer structure including the inorganic insulating material.

The pixel circuit PC including the TFT and the storage capacitor Cst may be covered by an inorganic insulating layer 208. The inorganic insulating layer 208 may prevent a wiring including a metal such as, for example, aluminum (Al), which may be damaged by an etchant during a manufacturing process of a display apparatus, from being exposed to an etching environment. The inorganic insulating layer 208 may extend to the intermediate area MA, and may cover the first metal layers MTL1 and some of the data lines DL.

The inorganic insulating layer 208 may include an inorganic material such as $SiO_x$, $SiN_x$, and/or SiON and may have a single or multi-layer structure. In an exemplary embodiment of the present disclosure, the inorganic insulating layer 208 may include $SiN_x$. The inorganic insulating layer 208 may have a thickness equal to or greater than about 500 Å. In an exemplary embodiment of the present disclosure, the inorganic insulating layer 208 may have a thickness equal to or greater than about 1,000 Å, equal to or greater than about 1,500 Å, equal to or greater than about 2,000 Å, equal to or greater than about 2,500 Å, equal to or greater than about 3,000 Å, equal to or greater than about 3,500 Å, equal to or greater than about 4,000 Å, equal to or greater than about 4,500 Å, equal to or greater than about 5,000 Å, equal to or greater than about 5,500 Å, equal to or greater than about 6,000 Å, or equal to or greater than about 6,500 Å. Alternatively, the inorganic insulating layer 208 may have a thickness ranging from about 7,000 Å to about 10,000 Å.

A first organic insulating layer 209 may be located on the inorganic insulating layer 208. The first organic insulating layer 209 may have a top surface that is substantially flat.

The pixel circuit PC may be electrically connected to a pixel electrode 221. For example, as shown in FIG. 9, a contact metal layer CM may be further located between the TFT and the pixel electrode 221. The contact metal layer CM may contact the TFT (e.g., contact the drain electrode DE of the TFT) through a contact hole formed in the first organic insulating layer 209, and the pixel electrode 221 may contact the contact metal layer CM through a contact hole formed in a second organic insulating layer 211 formed on the contact metal layer CM. The contact metal layer CM may include a conductive material including, for example, Ag, Mo, Al, Cu, Cr, Ni, Ti, or an alloy thereof and may have a single or multi-layer structure including the conductive material. In an exemplary embodiment of the present disclosure, the contact metal layer CM may have a multi-layer structure formed of Ti/Al/Ti.

Each of the first organic insulating layer 209 and the second organic insulating layer 211 may include an organic insulating material such as, for example, a general-purpose polymer (e.g., polymethyl methacrylate (PMMA) or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment of the present disclosure, each of the first organic insulating layer 209 and the second organic insulating layer 211 may include polyimide (PI). In an exemplary embodiment of the present disclosure, each of the first organic insulating layer 209 and the second organic insulating layer 211 may be formed by spin coating.

The pixel electrode 221 may be formed on the second organic insulating layer 211. The pixel electrode 221 may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment of the present disclosure, the pixel electrode 221 may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. In an exemplary embodiment of the present disclosure, the pixel electrode 221 may further include a film formed of, for example, ITO, IZO, ZnO, or $In_2O_3$ over/under the reflective film.

A pixel-defining film 215 may be formed on the pixel electrode 221. The pixel-defining film 215 may have an opening through which a top surface of the pixel electrode 221 is exposed and may cover an edge of the pixel electrode 221. The pixel-defining film 215 may include an organic insulating material. Alternatively, the pixel-defining film 215 may include an inorganic insulating material such as, for example, SiNx, SiON, or SiOx. Alternatively, the pixel-defining film 215 may include an organic insulating material and an inorganic insulating material.

An intermediate layer 222 located between the pixel electrode 221 and a counter electrode 223 includes an emission layer 222b and at least one organic layer. The intermediate layer 222 may include a first functional layer 222a located under the emission layer 222b and/or a second functional layer 222c located over the emission layer 222b. The at least one organic layer included in the intermediate layer 222 may include at least one of the first functional layer 222a and the second functional layer 222c. The emission layer 222b may include a high molecular or low molecular weight organic material that emits light of a predetermined color. In an exemplary embodiment of the present disclosure, the emission layer 222b may include at least one of materials emitting red, green, or blue light, and may include a fluorescent material or a phosphorescent material.

The first functional layer 222a may have a single or multi-layer structure. For example, when the first functional layer 222a is formed of a high molecular weight material, the first functional layer 222a may include a hole transport layer (HTL) having a single-layer structure including, for example, poly(3,4-ethylenedioxythiophene) (PEDOT) or polyaniline (PANI). When the first functional layer 222a is formed of a low molecular weight material, the first functional layer 222a may include a hole injection layer (HIL) and a hole transport layer (HTL).

The second functional layer 222c may be omitted. For example, it is preferable that, when each of the first functional layer 222a and the emission layer 222b is formed of a high molecular weight material, the second functional layer 222c is formed. The second functional layer 222c may have a single or multi-layer structure. The second functional layer 222c may include an electron transport layer (ETL) and/or an electron injection layer (EIL). Thus, the at least one organic layer included in the intermediate layer 222 may include one or more of a hole transport layer (HTL), a hole injection layer (HIL), an electron injection layer (EIL), and an electron transport layer (ETL).

The emission layer 222b of the intermediate layer 222 may be located for each pixel in the display area DA. The emission layer 222b may be patterned to correspond to the pixel electrode 221. Unlike the emission layer 222b, the first functional layer 222a and/or the second functional layer 222c of the intermediate layer 222 may be in the intermediate area MA as well as the display area DA. In the intermediate area MA, the first functional layer 222a and/or the second functional layer 222c may be disconnected by the grooves G.

The counter electrode 223 may be formed of a conductive material having a low work function. For example, the counter electrode 223 may include a (semi) transparent layer including, for example, Ag, Mg, Al, Pt, Pd, Au, Ni, Nd, Ir, Cr, lithium (Li), calcium (Ca), or an alloy thereof. Alternatively, the counter electrode 223 may further include a layer formed of ITO, IZO, ZnO, or $In_2O_3$ located on the (semi) transparent layer including the above material. The counter electrode 223 may also be formed in the intermediate area MA as well as the display area DA. The first functional layer 222a, the second functional layer 222c, and the counter electrode 223 may be formed by thermal evaporation.

A capping layer 230 may be located on the counter electrode 223. For example, the capping layer 230 may include lithium fluoride (LiF) and may be formed by thermal evaporation. In an exemplary embodiment of the present disclosure, the capping layer 230 may be omitted.

A spacer 217 may be formed on the pixel-defining film 215, and may include an organic insulating material such as PI. Alternatively, the spacer 217 may include an inorganic insulating material, or may include an organic insulating material and an inorganic insulating material.

The spacer 217 and the pixel-defining film 215 may include the same material or different materials. For example, the pixel-defining film 215 and the spacer 217 may be formed together through a photolithographic process using a halftone mask. In an exemplary embodiment of the present disclosure, the pixel-defining film 215 and the spacer 217 may include PI.

The OLED is covered by the thin-film encapsulation layer 300. The thin-film encapsulation layer 300 may include at least one organic encapsulation layer and at least one inorganic encapsulation layer, and in FIG. 9, the thin-film encapsulation layer 300 includes first and second inorganic encapsulation layers 310 and 330 and an organic encapsulation layer 320 located between the first and second inorganic encapsulation layers 310 and 330. In an exemplary embodiment of the present disclosure, the number of organic encapsulation layers and the number of inorganic encapsulation layers and an order of stacking organic encapsulation layers and inorganic encapsulation layers may be changed.

Each of the first inorganic encapsulation layer 310 and the second inorganic encapsulation layer 330 may include one or more inorganic materials from among, for example, $Al_2O_3$, $TiO_2$, $Ta_2O_5$, $HfO_2$, ZnO, SiOx, SiNx, and SiON. Each of the first inorganic encapsulation layer 310 and the second inorganic encapsulation layer 330 may have a single or multi-layer structure including the one or more inorganic materials. The first inorganic encapsulation layer 310 may be formed to cover the capping layer 230 which is located on the counter electrode 223, and may prevent external moisture or oxygen from penetrating into the OLED. The first inorganic encapsulation layer 310 may be formed through a deposition process.

The organic encapsulation layer 320 may include a polymer-based material. Examples of the polymer-based material may include, for example, an acrylic resin, an epoxy-based resin, PI, and polyethylene. In an exemplary embodiment of the present disclosure, the organic encapsulation layer 320 may include acrylate. In an exemplary embodiment of the present disclosure, the organic encapsulation layer 320 may be formed through a solution process such as, for example, a spin coating process, a slit coating process, or an inkjet process. The organic encapsulation layer 320 may provide a flat surface on the first inorganic encapsulation layer 310, and may relieve the stress between the contacting layers.

Thicknesses of the first inorganic encapsulation layer 310 and the second inorganic encapsulation layer 330 may be different from each other. A thickness of the first inorganic encapsulation layer 310 may be greater than a thickness of the second inorganic encapsulation layer 330. Alternatively, a thickness of the second inorganic encapsulation layer 330 may be greater than a thickness of the first inorganic encapsulation layer 310, or a thickness of the first inorganic encapsulation layer 310 may be the same as a thickness of the second inorganic encapsulation layer 330.

Referring to the intermediate area MA of FIG. 9, the intermediate area MA may include a first sub-intermediate area SMA1 relatively far from the first area OA and a second sub-intermediate area SMA2 relatively close to the first area OA. Lines such as the data lines DL and the scan lines SL, and the grooves G that bypass the first area OA may be located in the intermediate area MA.

Lines, for example, the data lines DL, may be located in the first sub-intermediate area SMA1, as shown in FIG. 9. The data lines DL of the first sub-intermediate area SMA1 of FIG. 9 correspond to bypassing portions (e.g., DL-D1 and DL-D2) of the data lines DL of FIG. 7. The first sub-intermediate area SMA1 may be a line area or a bypassing area where lines such as the data lines DL bypass.

The data lines DL may be alternately arranged with an insulating layer disposed therebetween. For example, adjacent data lines DL are alternately located so that one of the adjacent data lines DL is located under an insulating layer (e.g., the first organic insulating layer 209) and the other is located over the insulating layer (e.g., the first organic insulating layer 209). As shown in FIG. 7, the bypassing portion DL-D1 and the extending portion DL-L1 of at least one data line DL from among the data lines DL may be formed on different layers, and the bypassing portion DL-D2 and the extending portion DL-L2 of at least one data line DL from among the data lines DL may be located on the same layer. When the data lines DL are alternately located with an insulating layer disposed therebetween, a distance (e.g., a gap Δd in the X direction or in the plan view) between the data lines DL may be reduced. Although the data lines DL are located in the sub-intermediate area SMA1 in FIG. 9, the scan lines SL of FIG. 7, for example, bypassing portions of the scan lines SL, may also be located in the first sub-intermediate area SMA1.

One or more grooves G may be located in the second sub-intermediate area SMA2. An organic layer or organic layers included in the intermediate layer 222, for example, the first functional layer 222a and/or the second functional layer 222c, may be disconnected (or separated) by the groove G. The second sub-intermediate area SMA2 may be a groove area or a disconnection area (separation area) of the organic layer. For example, the groove G may be formed to disconnect any organic layers in the second sub-intermediate area SMA2. Like the first functional layer 222a and/or the second functional layer 222c, the counter electrode 223 formed by thermal evaporation may be disconnected by the groove G. The capping layer 230 including LiF or the like may also be disconnected by the groove G.

Some of layers disconnected by the groove G may remain as a residual layer GP in the groove G. The residual layer GP may be located on a bottom surface of the groove G and may be located on the inorganic insulating layer 208 in FIG. 9. In an exemplary embodiment of the present disclosure, the residual layer GP in the groove G may include a part 222aP of the first functional layer 222a, a part 222cP of the second functional layer 222c, a part 223P of the counter electrode 223, and a part 230P of the capping layer 230. They may be sequentially stacked in the groove G in the order of the part 222aP of the first functional layer 222a, the part 222cP of the second functional layer 222c, the part 223P of the counter electrode 223, and the part 230P of the capping layer 230 in a manufacturing process.

The groove G may be formed on a multi-layered film ML located between the substrate 100 and the pixel electrode 221. The multi-layered film ML may include a first sub-layer including an organic layer and a second sub-layer including an inorganic layer. In this regard, in FIG. 9, the multi-layered film ML includes the first metal layer MTL1, the inorganic insulating layer 208, the first organic insulating layer 209, and the second metal layer MTL2. The multi-layered film ML may include at least one groove G adjacent to the contact portion CT and defined in the multi-layered film ML, and at least one organic layer included in the intermediate layer 222 is disconnected by the at least one groove G.

The first metal layer MTL1 may be formed on a layer (second interlayer insulating layer 207) the same as that of the source electrode SE and the drain electrode DE that are connection electrodes of the TFT, and may be formed by using a mask process the same as that of the source electrode SE and the drain electrode DE. The first metal layer MTL1 may include a material the same as that of the source electrode SE and the drain electrode DE. For example, the first metal layer MTL1 may include a metal and may include three sub-layers formed of, for example, Ti/Al/Ti. Since source electrode SE and the drain electrode DE may be located on a layer the same as that of the data line DL, and may include a material the same as that of the data line DL, the data line DL may include a material the same as that of the first metal layer MTL1. In an exemplary embodiment of the present disclosure, the first metal layer MTL1 may include a floating metal disconnected from an electrical signal. Unlike the data line DL and the scan line SL, the first metal layer MTL1 is not connected to provide any electrical signal.

The second metal layer MTL2 may be located on a layer (first organic insulating layer 209) the same as that of the contact metal layer CM and may be formed by using a mask process the same as that of the contact metal layer CM. The second metal layer MTL2 may include a material the same as that of the contact metal layer CM. For example, the second metal layer MTL2 may include a metal and may include three sub-layers formed of, for example, Ti/Al/Ti. In an exemplary embodiment of the present disclosure, the data line DL may include a material the same as that of at least one of the first metal layer MTL1 and the second metal layer MTL2.

The groove G will be described in detail with reference to FIGS. 9 and 10A.

Referring to FIGS. 9 and 10A, the groove G of the multi-layered film ML may be formed before a process of forming the intermediate layer 222. The groove G may have an undercut structure. The groove G may have a first hole 210h formed in the second metal layer MTL2 and a second hole 209h (or a recess corresponding to the first hole 210h) formed in the first organic insulating layer 209. Thus, the residual layer GP may be located in the second hole 209h (or the recess corresponding to the first hole 210h), may include a part of the at least one organic layer of the intermediate layer 222, and may overlap the first metal layer MTL1. In FIG. 10A, the first hole 210h and the second hole 209h overlapping each other form the groove G.

A bottom surface of the groove G may be located on an imaginary surface located between a top surface of the substrate 100 and a top surface of the first organic insulating layer 209, and in this regard, in FIG. 10A, the bottom surface of the groove G is located on an imaginary surface the same as a top surface 208a of the inorganic insulating layer 208. Here, the bottom surface of the groove G has an imaginary surface, and the top surface 208a of the inorganic insulating layer 208 has a real surface. That is, the groove G may expose at least a part of the top surface 208a of the inorganic insulating layer 208.

In an exemplary embodiment of the present disclosure, the bottom surface of the groove G may be located on an imaginary surface between a top surface MTL1a (see FIG. 10C) of the first metal layer MTL1 and the top surface 208a of the inorganic insulating layer 208. In this case, the groove G may include the first hole 210h formed in the second metal layer MTL2, the second hole 209h formed in the first organic insulating layer 209, and a recess formed in the inorganic insulating layer 208. The recess may be a portion concave toward the substrate 100 by removing a part of the inorganic insulating layer 208 without passing through the inorganic insulating layer 208.

End portions of the second metal layer MTL2 defining the first hole 210h may protrude toward the center of the groove G more than an inner surface of the first organic insulating layer 209 located under the second metal layer MTL2. For example, a first width W1 of the first hole 210h may be less than a second width W2 of the second hole 209h, and the second width W2 of the second hole 209h may be a width of a portion of the second hole 209h under the end portions of the second metal layer MTL2 defining the first hole 210h. In an exemplary embodiment of the present disclosure, the groove G may be formed by an isotropic etching process, and thus may have an undercut structure. The end portions of the second metal layer MTL2 protruding toward the center of the groove G and/or the first hole 210h may form a pair of eaves (or a pair of protruding tips or tips PT). A protruding length d1 of each of the tips PT may be less than a depth h1 of the second hole 209h as described below. For example, the protruding length d1 of the tip PT may range from, for example, about 1 μm to about 1.5 μm.

Although a first end portion of the second metal layer MTL2 forming the tip PT may be exposed as shown in FIG. 9, the opposite end portion, for example, a second end portion 210e (see FIG. 10A), may be covered by the second organic insulating layer 211.

The depth h1 of the second hole 209h may be the same as a thickness t1 of the first organic insulating layer 209. Here, the depth h1 of the second hole 209h may be defined based on a top surface of the first organic insulating layer 209, for example, may be measured from the top surface of the first organic insulating layer 209. The depth h1 of the second hole 209h may correspond to a depth of the groove G. In an exemplary embodiment of the present disclosure, a depth of the groove G may be equal to or greater than about 1.5 μm. For example, a depth of the groove G may be equal to or greater than about 3 μm, and preferably, may be equal to or greater than about 2 μm.

The first organic insulating layer 209 may have a first opening 2090D. The first opening 2090D may be located adjacent to the groove G and may be spaced apart by a predetermined interval from the groove G. In an exemplary embodiment of the present disclosure, the first openings 2090D may be located at both sides of the groove G as shown in FIG. 10A. For example, one first opening 2090D may be located at a side of the groove G close to the display area DA, and the other first opening 2090D may be located at a side of the groove G close to the first area OA.

The inorganic insulating layer 208 may have a second opening 2080D. The second opening 2080D may correspond to the first opening 2090D. That is, the second opening 2080D may extend from the first opening 2090D. The second opening 2080D and the first opening 2090D may be formed together in a process of forming a contact hole through which the contact metal layer CM and the drain electrode DE in the display area DA are connected to each other.

Figure 10B:
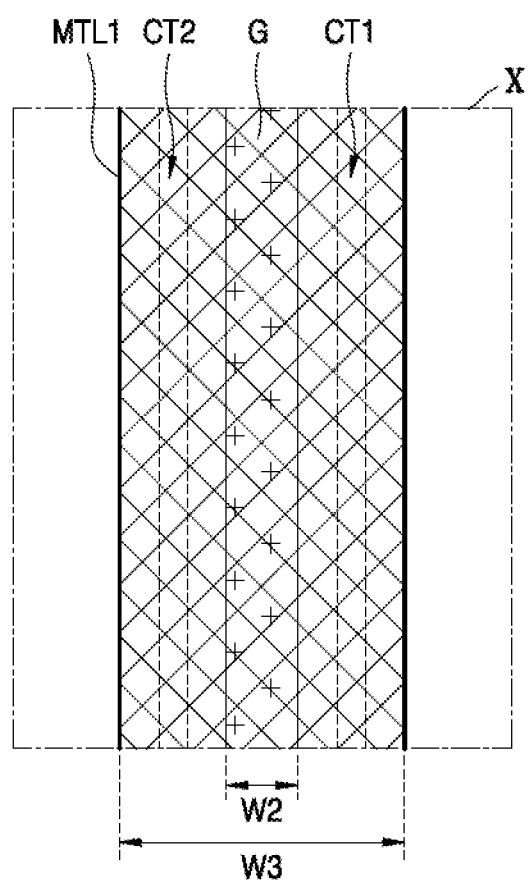
Figure 10C:
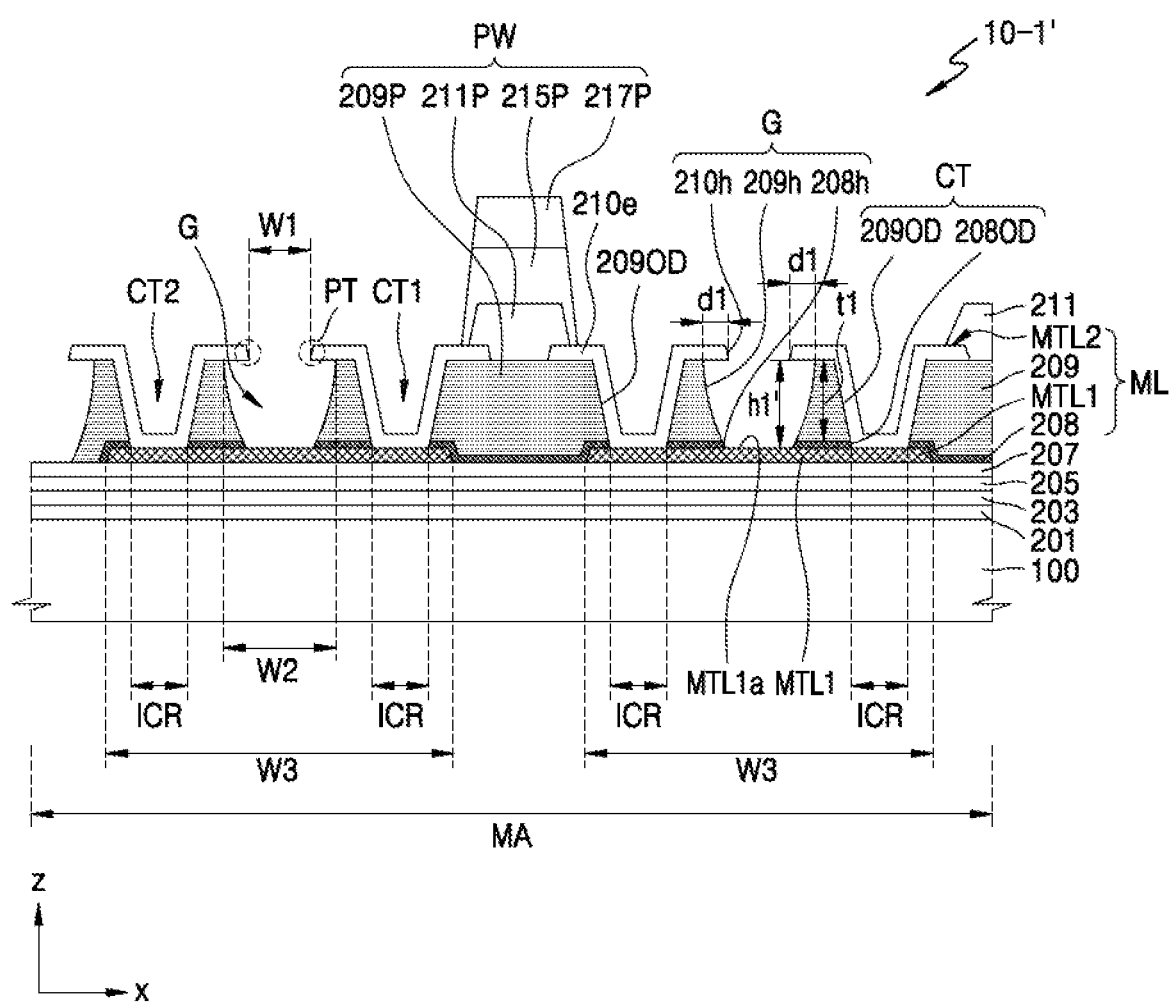

The second metal layer MTL2 and the first metal layer MTL1 may directly contact each other through at least one contact portion CT located adjacent to the groove G. Although at least one contact portion CT includes a first contact portion CT1 and a second contact portion CT2 with the groove G located therebetween in FIG. 10A, the present disclosure is not limited thereto. For example, two or more grooves G may be formed to locate between the first contact portion CT1 and the second contact portion CT2. The first contact portion CT1 and the second contact portion CT2 may extend along the groove G to be spaced apart by a predetermined interval from each other as shown in FIG. 10B. For example, the at least one contact portion CT of the first organic insulating layer 209 may include the first contact portion CT1 and the second contact portion CT2 with at least one groove G located therebetween.

The contact portion CT may include the first opening 2090D defined in the first organic insulating layer 209 and the second opening 2080D defined in the inorganic insulating layer 208. That is, the second metal layer MTL2 may directly contact a layer lower than the inorganic insulating layer 208, for example, the first metal layer MTL1, under the first organic insulating layer 209 through the first opening 2090D and the second opening 2080D. The second metal layer MTL2 and the first metal layer MTL1 contacting each other through the first opening 2090D and the second opening 2080D may form an inorganic contact region ICR.

Accordingly, the inorganic contact region ICR may be formed of metal-metal contact, thereby providing a structure better than a structure having a lower inorganic film (SiON) as part of the inorganic contact region ICR in preventing moisture from penetrating into the OLED.

A layer including an organic material from among layers on the substrate 100 may become a path through which moisture penetrates. In an exemplary embodiment of the present disclosure, when the display panel 10-1 includes a through portion 10H (i.e., the first opening 10H as shown in FIGS. 2A, 2B, 4A and 4B) corresponding to the first area OA as shown in FIG. 9, moisture may penetrate in a direction (e.g., an X direction, hereinafter, referred to as a lateral direction) parallel to a top surface of the substrate 100 through the through portion 10H, but according to an exemplary embodiment of the present disclosure, the intermediate area MA includes the inorganic contact region ICR and thus may prevent moisture from penetrating into the display area DA through the first organic insulating layer 209. The groove G may also disconnect any organic layers to prevent moisture from penetrating into the display area DA through these organic layers.

The partition wall PW may be located between the grooves G. The partition wall PW may include a plurality of sub-organic insulating layers that are sequentially stacked. In an exemplary embodiment of the present disclosure, the partition wall PW may have a structure in which a part 209P of the first organic insulating layer 209, a part 211P of the second organic insulating layer 211, a part 215P of the pixel-defining film 215, and a part 217P of the spacer 217 are stacked as shown in FIG. 10A. In an exemplary embodiment of the present disclosure, one or more of the part 209P of the first organic insulating layer 209, the part 211P of the second organic insulating layer 211, the part 215P of the pixel-defining film 215, and the part 217P of the spacer 217 may be omitted, and in this case, a height from the substrate 100 to a top surface of the partition wall PW may be less than a height from the substrate 100 to a top surface of the spacer 217. In an exemplary embodiment of the present disclosure, two or more partition walls PW may be formed in the intermediate area MA, and the two or more partition walls PW may have the same structure or different structures.

FIG. 10B is an enlarged view illustrating a region X of FIG. 8.

Referring to FIGS. 10A and 10B, a width W3 of the first metal layer MTL1 may be greater than the second with W2 of the second hole 209h. The second width W2 of the second hole 209h may be a width of the groove G. Here, the second width W2 may be a width of a portion of the second hole 209h of the groove G right under the end portions of the second metal layer MTL2 defining the first hole 210h. A width of the groove G may be interpreted as the first width W1 of the first hole 210h corresponding to an entrance of the groove Gas shown in FIG. 10A.

At least one lower insulating layer may be located under the first organic insulating layer 209, in which the at least one lower insulating layer may include the inorganic insulating layer 208. Referring to FIGS. 9 and 10O, FIG. 10O is different from FIG. 10A in a shape of the groove G. The groove G of FIG. 10O may include the first hole 210h formed in the second metal layer MTL2, the second hole 209h formed in the first organic insulating layer 209, and a third hole 208h formed in the inorganic insulating layer 208. For example, the inorganic insulating layer 208 may include the third hole 208h or a second recess corresponding to the second hole 209h and passing through the inorganic insulating layer 208.

In FIG. 10O, the first hole 210h, the second hole 209h, and the third hole 208h overlapping one another form the groove G. A bottom surface of the groove G may be located on an imaginary surface located between a top surface of the substrate 100 and a top surface of the first organic insulating layer 209, and in this regard, in FIG. 10O, the bottom surface of the groove G is located on an imaginary surface the same as the top surface MTL1a of the first metal layer MTL1. That is, the groove G may expose at least a part of the top surface MTL1a of the first metal layer MTL1. For example, the second hole 209h may extend into the inorganic insulating layer 208 by forming the third hole 208h and may then expose at least a part of the top surface MTL1a of the first metal layer MTL1.

In the present exemplary embodiment, a depth h1' of the groove G may be the same as a sum of depths of the second hole 209h and the third hole 208h. Accordingly, the depth h1' of the groove G may be greater than the thickness t1 of the first organic insulating layer 209. In an exemplary embodiment of the present disclosure, a depth of the groove G may be equal to or greater than about 1.5 μm. For example, a depth of the groove G may be equal to or greater than about 3 μm, and preferably, may be equal to or greater than about 2 μm.

Figure 11:
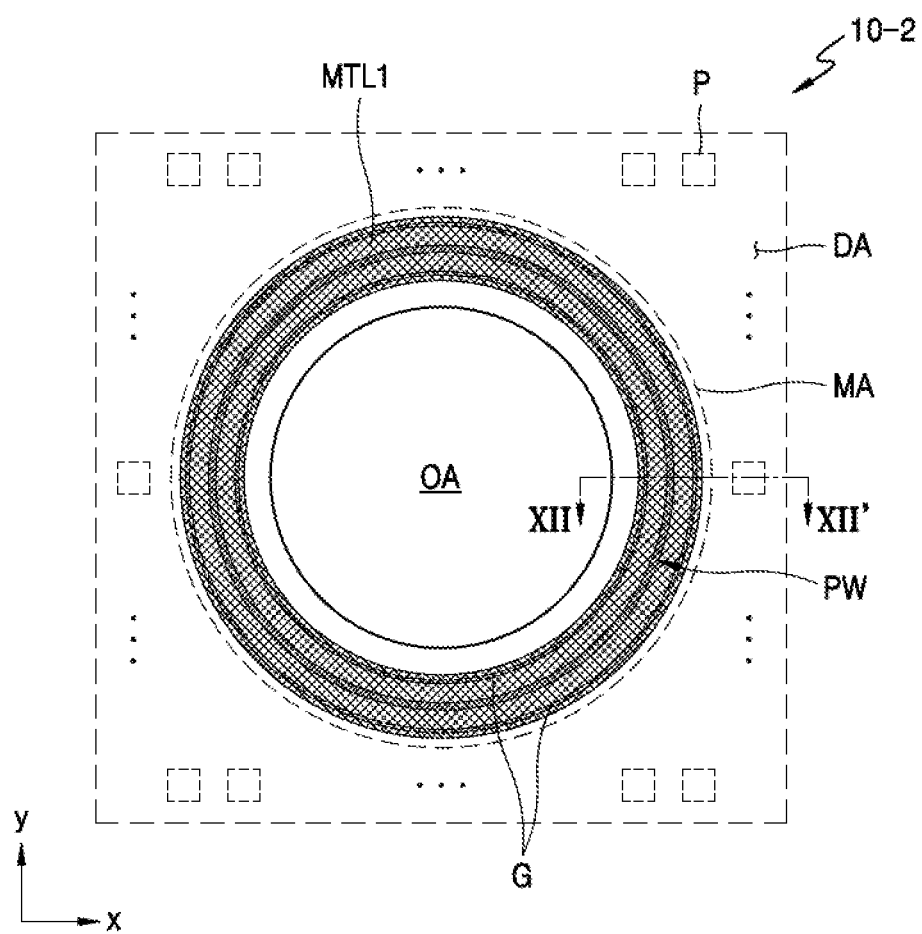
FIG. 11 is a plan view illustrating a part of a display panel according to an exemplary embodiment of the present disclosure.
Figure 12:
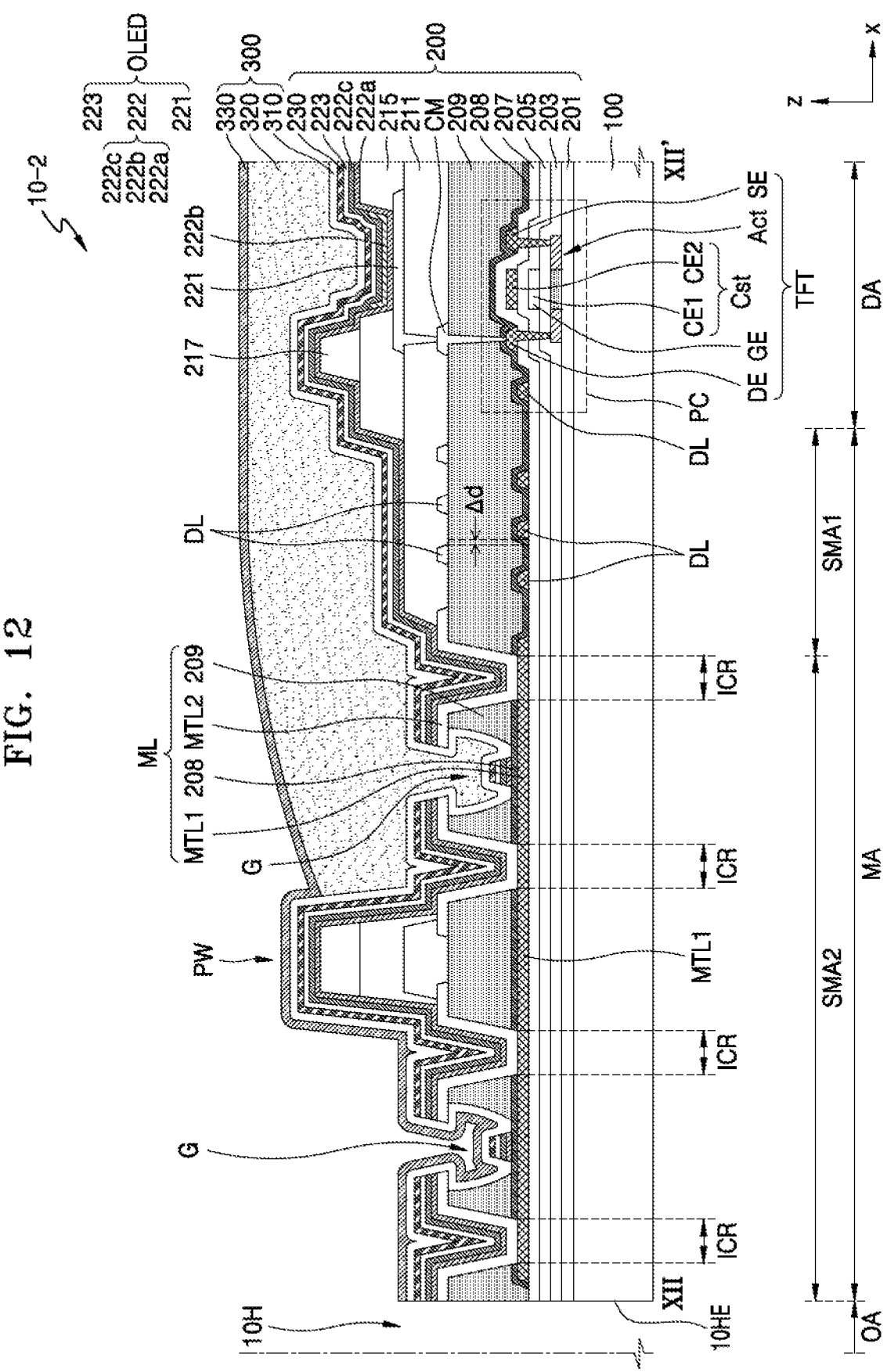
FIG. 12 is a cross-sectional view of the display panel according to an exemplary embodiment of the present disclosure.
Figure 13A:
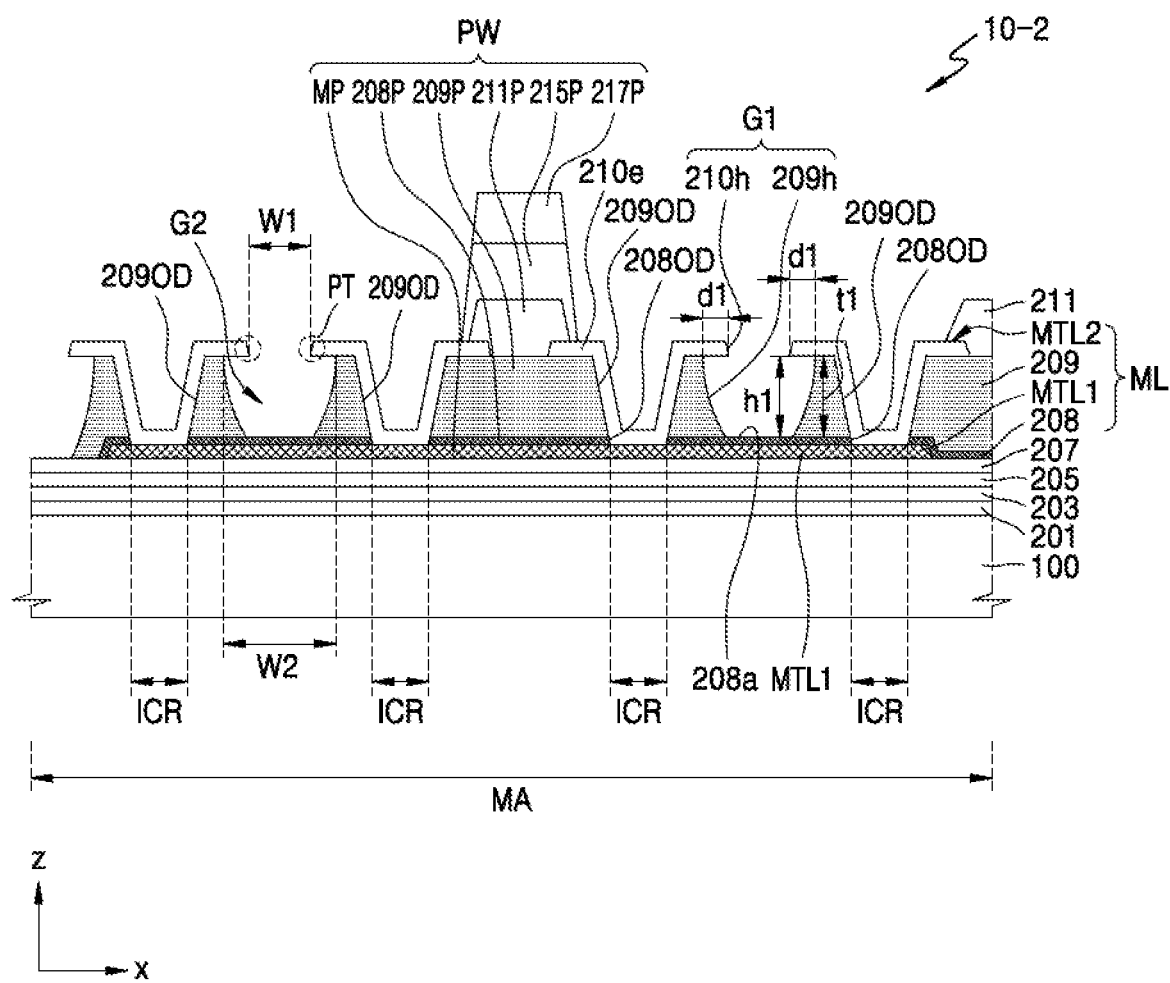
FIGS. 13A and 13B are cross-sectional views of a manufacturing process of the display panel according to an exemplary embodiment of the present disclosure.
Figure 13B:
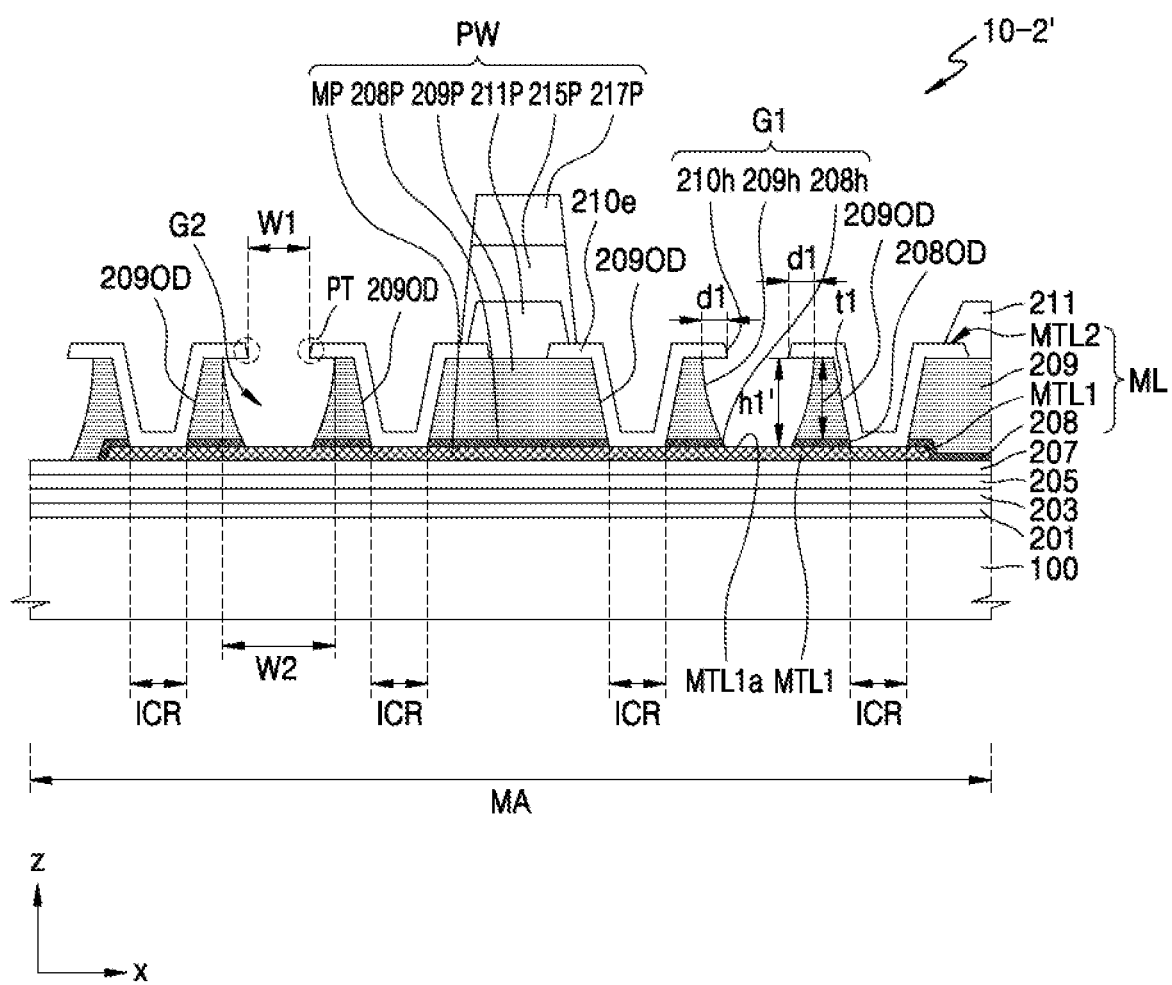

FIG. 11 is a plan view illustrating a part of a display panel 10-2 according to an exemplary embodiment of the present disclosure, and FIG. 12 is a cross-sectional view of the display panel 10-2 according to an exemplary embodiment of the present disclosure, taken along line XII-XII' of FIG. 11. Also, FIGS. 13A and 13B are cross-sectional views of a manufacturing process of the display panel 10-2 according to an exemplary embodiment of the present disclosure, illustrating the intermediate area MA.

Referring to FIG. 11, the partition wall PW and at least one groove G may be provided in the intermediate area MA to surround the first area OA. The partition wall PW and the groove G in FIG. 11 are the same as those of FIG. 8 in an arrangement, but are different from those of FIG. 8 in a shape of the first metal layer MTL1.

The first metal layer MTL1 may overlap the grooves G in the intermediate area MA. In FIG. 11, the first metal layer MTL1 may overlap the grooves G and the partition wall PW located between the grooves G.

FIG. 12 is the same as FIG. 9 except for the intermediate area MA, particularly, the second sub-intermediate area SMA2, and thus the following description will focus on the second sub-intermediate area SMA2.

Referring to the intermediate area MA of FIG. 12, one or more grooves G may be located in the second sub-intermediate area SMA2. An organic layer or organic layers included in the intermediate layer 222, for example, the first functional layer 222a and/or the second functional layer 222c, may be disconnected (or separated) by the groove G. Thus, moisture may be prevented from penetrating into the OLED through the first functional layer 222a and/or the second functional layer 222c. The counter electrode 223 and the capping layer 230 may also be disconnected by the groove G.

The groove G may be formed on and defined in the multi-layered film ML located between the substrate 100 and the pixel electrode 221. The multi-layered film ML may include a first sub-layer including an organic layer and a second sub-layer including an inorganic layer. In this regard, in FIG. 12, the multi-layered film ML includes the first metal layer MTL1, the inorganic insulating layer 208, the first organic insulating layer 209, and the second metal layer MTL2.

In the present exemplary embodiment, the first metal layer MTL1 may be located to correspond to the grooves G and the partition wall PW located between the grooves G. Referring to FIGS. 12 and 13A, the grooves G may include a first groove G1 located at a side of the partition wall PW close to the display area DA and a second groove G2 located at a side of the partition wall PW close to the first area OA. In this case, the first groove G1 and the second groove G2 may be grooves closest to the partition wall PW.

The first metal layer MTL1 may be located under the first groove G1 and the second groove G2 and may extend to be located under the partition wall PW located between the first groove G1 and the second groove G2. Because the first metal layer MTL1 is located not only under the first groove G1 and the second groove G2 but also under the partition wall PW, a height from the substrate 100 to a top surface of the partition wall PW shown in FIG. 12 may be greater than that of FIG. 9.

Although the first metal layer MTL1 is continuously located under the first groove G1, the partition wall PW, and the second groove G2, the first metal layer MTL1 may not be provided on an edge 10HE of the through portion 10H corresponding to the first area OA. This is because cutting is not easy when a metal layer is located on a cutting line portion during a scribing or cutting process for forming the through portion 10H. For example, when a laser cutting method is used and a metal layer is located on a cutting line portion, laser reflection may occur on the metal layer and it may not be easy to perform the cutting process on films under the metal layer. On the other hand, the first metal layer MTL1 may alleviate a laser damage to other portions of the display panel 10-2. In an exemplary embodiment of the present disclosure, the first metal layer MTL1 may be disposed along the edge 10HE (e.g., near the edge 10HE, but not on the edge 10HE) of the through portion 10H corresponding to the first area OA and may overlap the partition wall PW and a portion of the thin-film encapsulation layer 300. Thus, the first metal layer MTL1 may prevent the partition wall PW and the thin-film encapsulation layer 300 from being damaged by the laser or the like when forming the through portion 10H.

The groove G will be described in detail with reference to FIGS. 12 and 13A. FIG. 13A is similar to FIG. 10A, but is different from FIG. 10A in a shape of the first metal layer MTL1. A repeated explanation of the same elements as those of FIG. 10A will not be given and the following description will mainly focus on a difference therebetween.

Referring to FIGS. 12 and 13A, the first and second grooves G1 and G2 of the multi-layered film ML may be formed before a process of forming the intermediate layer 222. Each of the first and second grooves G1 and G2 may have an undercut structure. Each of the first and second grooves G1 and G2 may have the first hole 210h formed in the second metal layer MTL2 and a groove or the second hole 209h formed in the first organic insulating layer 209.

In FIG. 13A, the first hole 210h and the second hole 209h overlapping each other form each of the first and second grooves G1 and G2. A bottom surface of each of the first and second grooves G1 and G2 may be located on an imaginary surface located between a top surface of the substrate 100 and a top surface of the first organic insulating layer 209, and in this regard, in FIG. 13A, the bottom surface of each of the first and second grooves G1 and G2 is located on the imaginary surface the same as a top surface of the inorganic insulating layer 208. Here, the bottom surface of each of the first and second grooves G1 and G2 has an imaginary surface, and the top surface of the inorganic insulating layer 208 has a real surface. That is, each of the first and second grooves G1 and G2 may expose at least a part of the top surface of the inorganic insulating layer 208.

The first and second openings 2090D and 2080D may be formed at both sides of each of the first and second grooves G1 and G2, and the first metal layer MTL1 and the second metal layer MTL2 directly contacting each other through the first and second openings 2090D and 2080D may form the inorganic contact region ICR. Accordingly, the inorganic contact region ICR may be formed of metal-metal contact, thereby providing a structure better than a structure having a lower inorganic film (SiON) as part of the inorganic contact region ICR in preventing moisture from penetrating into the display area DA.

The partition wall PW may be located between the first and second grooves G1 and G2. The partition wall PW may include a plurality of sub-organic insulating layers that are sequentially stacked. In an exemplary embodiment of the present disclosure, the partition wall PW may have a structure in which a part MP of the first metal layer MTL1, a part 208P of the inorganic insulating layer 208, the part 209P of the first organic insulating layer 209, the part 211P of the second organic insulating layer 211, the part 215P of the pixel-defining film 215, and the part 217P of the spacer 217 are stacked as shown in FIG. 13A.

Referring to FIG. 13B, FIG. 13B is different from FIG. 13A in that each of the first and second grooves G1 and G2 is defined as the first hole 210h, the second hole 209h, and the third hole 208h.

Each of the first and second grooves G1 and G2 may include the first hole 210h formed in the second metal layer MTL2, the second hole 209h formed in the first organic insulating layer 209, and the third hole 208h formed in the inorganic insulating layer 208. A bottom surface of each of the first and second grooves G1 and G2 may be located on an imaginary surface located between a top surface of the substrate 100 and a top surface of the first organic insulating layer 209, and in this regard, in FIG. 13B, the bottom surface of each of the first and second grooves G1 and G2 is located on an imaginary surface the same as the top surface MTL1a of the first metal layer MTL1. That is, each of the first and second grooves G1 and G2 may expose at least a part of the top surface MTL1a of the first metal layer MTL1.

In the present exemplary embodiment, a depth h1' of each of the first and second grooves G1 and G2 may be the same as a sum of depths of the second hole 209h and the third hole 208h. The depth h1' of each of the first and second grooves G1 and G2 may be greater than the thickness t1 of the first organic insulating layer 209.

Figure 14A:
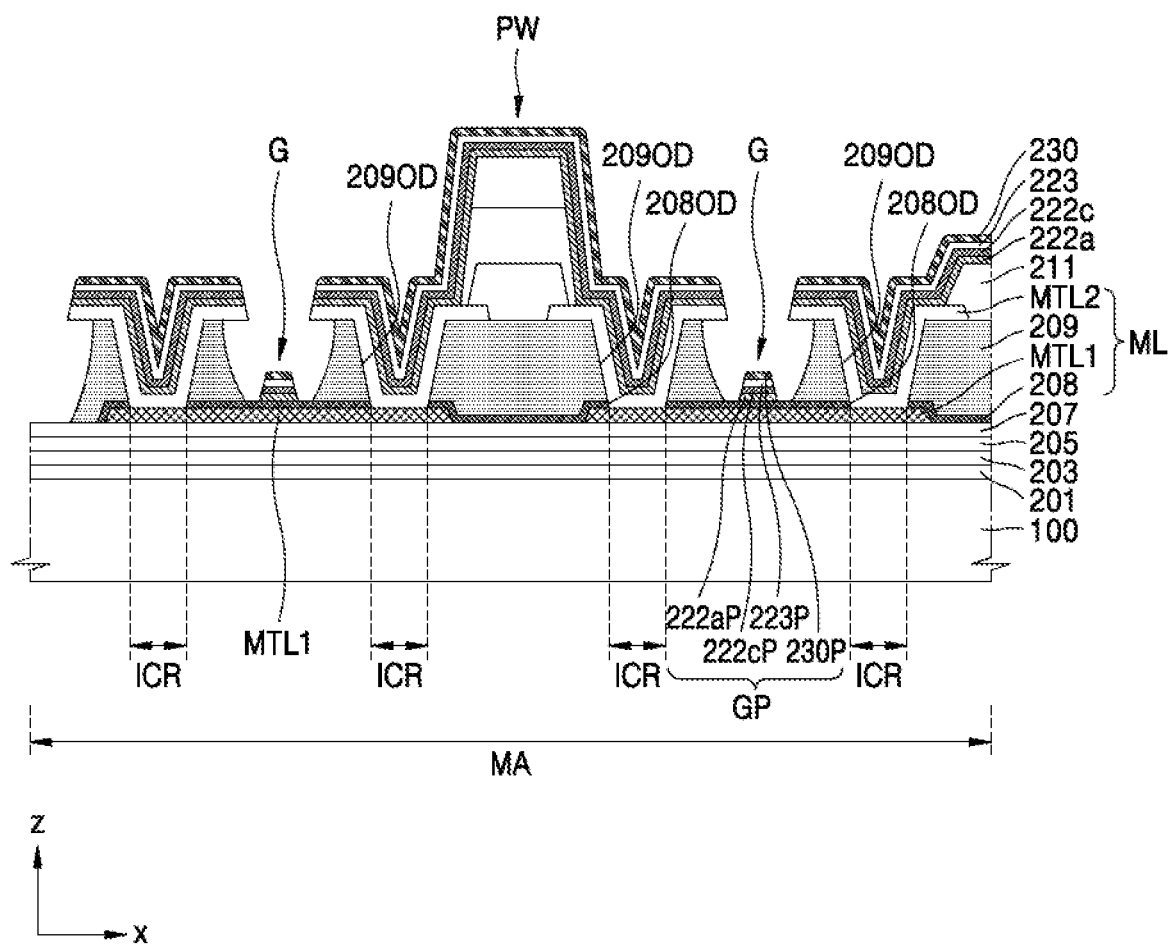
FIGS. 14A, 14B, and 15 are cross-sectional views of a manufacturing process of a display panel according to an exemplary embodiment of the present disclosure.
Figure 14B:
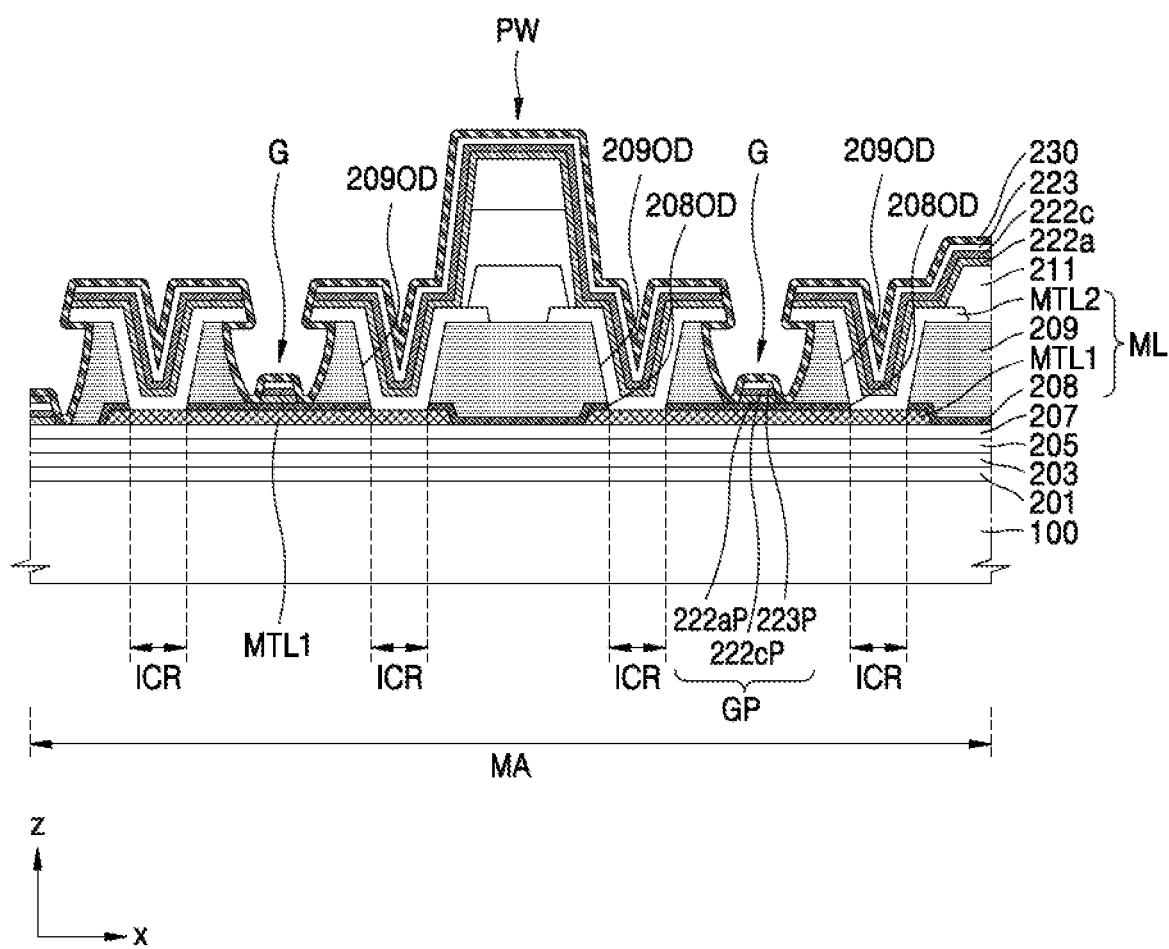
Figure 15:
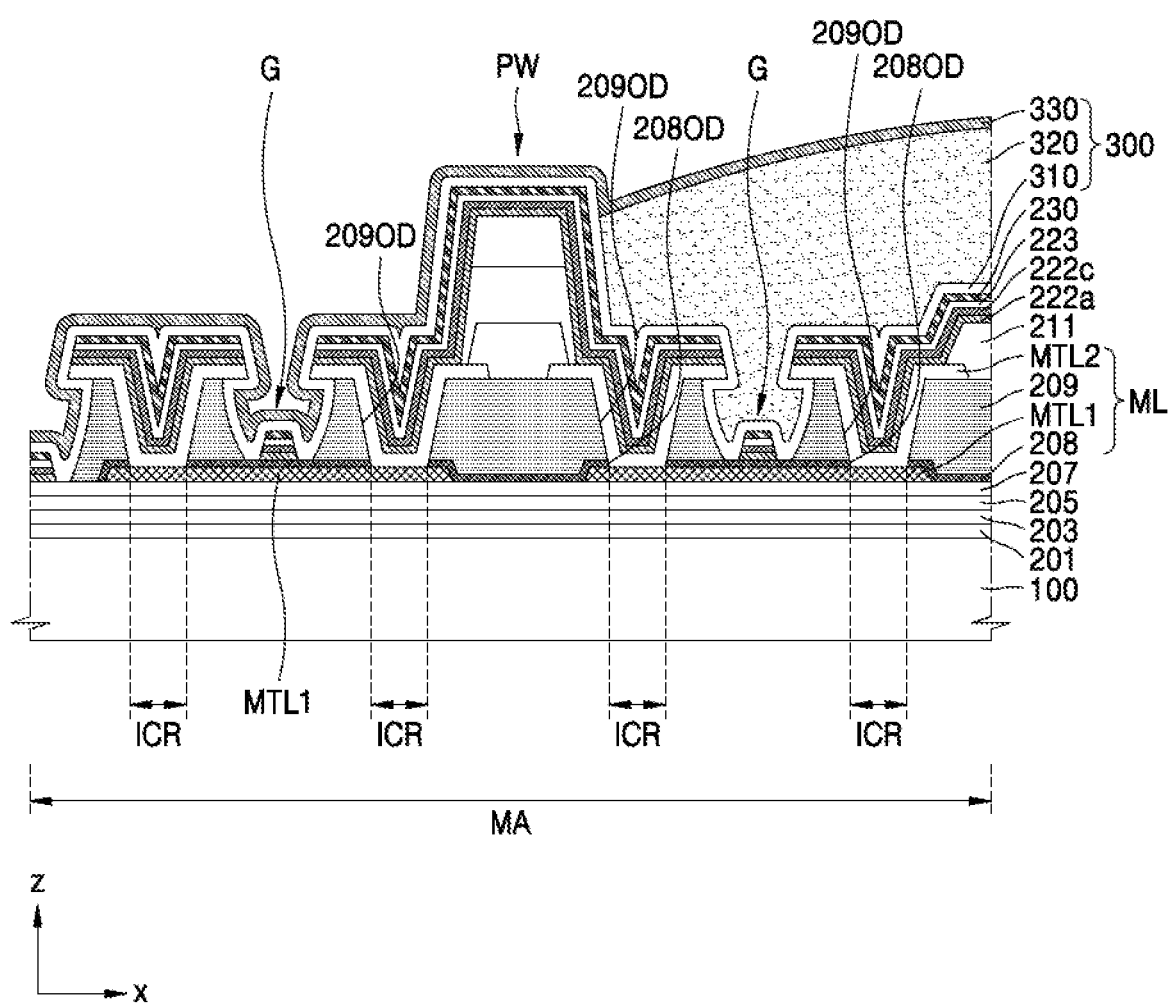

FIGS. 14A, 14B, and 15 are cross-sectional views of a manufacturing process of a display panel according to an exemplary embodiment of the present disclosure, illustrating the intermediate area MA. FIGS. 14A and 14B illustrate a process after FIG. 10A.

Referring back to FIGS. 9, 10A, and 14A, the intermediate layer 222 may be formed after the groove G is formed. The first functional layer 222a and/or the second functional layer 222c of the intermediate layer 222 may be integrally formed by using an open mask or the like to be located in the display area DA and the intermediate area MA. In this case, the first functional layer 222a and/or the second functional layer 222c may be disconnected or separated by the groove G. In an exemplary embodiment of the present disclosure, the intermediate layer 222 may be formed by a non-conformal deposition process, and thus, the intermediate layer 222 may not be formed on the sidewalls of the first hole 210h, the second hole 209h, and/or the third hole 208h.

A layer including an organic material from among layers on the substrate 100 may become a path through which moisture penetrates. Although the first functional layer 222a and/or the second functional layer 222c includes an organic layer and may become a penetration path, the first functional layer 222a and/or the second functional layer 222c is disconnected or separated by the groove G, and thus moisture may be prevented from penetrating into the OLED through the first functional layer 222a and/or the second functional layer 222c. For example, the groove G may be configured to disconnect any organic layer formed above the second metal layer MTL2 to prevent moisture from penetrating into the OLED. Thus, it is possible to prevent damage to the OLED disposed in the display area DA by cutting off the infiltration path of external moisture or oxygen.

Like the first functional layer 222a and/or the second functional layer 222c, the counter electrode 223 formed by thermal evaporation may also be disconnected by the groove G. The capping layer 230 including LiF may also be disconnected by the groove G.

Some of layers disconnected (or separated) by the groove G may remain as a residual layer GP in the groove G. In an exemplary embodiment of the present disclosure, the residual layer GP in the groove G may include the part 222aP of the first functional layer 222a, the part 222cP of the second functional layer 222c, the part 223P of the counter electrode 223, and the part 230P of the capping layer 230.

In an exemplary embodiment of the present disclosure, when the capping layer 230 includes an inorganic material such as, for example, SiNx, SiOx, or SiON as shown in FIG. 14B, the capping layer 230 may be continuously formed without being disconnected by the groove G. In an exemplary embodiment of the present disclosure, instead of the thermal evaporation process, the capping layer 230 may be conformally formed on the display area DA and the intermediate area MA by a process such as, for example, an atomic layer deposition (ALD) process, or a chemical vapor deposition (CVD) process. In an exemplary embodiment of the present disclosure, the capping layer 230 may be omitted. When the capping layer 230 is continuously formed without being disconnected by the groove G as shown in FIG. 14B, the residual layer GP may include the part 222aP of the first functional layer 222a, the part 222cP of the second functional layer 222c, and the part 223P of the counter electrode 223.

A structure of the intermediate layer 222, the counter electrode 223, and the capping layer 230 of FIG. 14A or 14B may be applied to an exemplary embodiment of FIGS. 11 through 13B.

Referring to FIGS. 9 and 15, the thin-film encapsulation layer 300 may be formed. The thin-film encapsulation layer 300 may cover the OLED in the display area DA and may prevent the OLED from being damaged or degraded by external impurities.

The thin-film encapsulation layer 300 may include at least one organic encapsulation layer and at least one inorganic encapsulation layer. The first inorganic encapsulation layer 310 formed by chemical vapor deposition (CVD) process or the like may have a step coverage better than that of the first functional layer 222a, the second functional layer 222c, and/or the counter electrode 223, and the first inorganic encapsulation layer 310 may be continuously formed as shown in FIG. 9. For example, the first inorganic encapsulation layer 310 may entirely cover an inner surface of the groove G.

The organic encapsulation layer 320 may be formed by applying a monomer or a polymer to the substrate 100 and then curing the monomer or the polymer. The organic encapsulation layer 320 may extend from the display area DA to the intermediate area MA, and may have a relatively flat surface. An end portion of the organic encapsulation layer 320 facing the first area OA may be located adjacent to a side of the partition wall PW. The partition wall PW may function as a dam that prevents the end portion of the organic encapsulation layer 320 from overflowing to an edge (in the present exemplary embodiment, a boundary between the intermediate area MA and the first area OA) of the substrate 100.

The second inorganic encapsulation layer 330 may be located on the organic encapsulation layer 320, and may directly contact the first inorganic encapsulation layer 310 in a part of the intermediate area MA. For example, as shown in FIGS. 9 and 15, in a portion of the intermediate area MA adjacent to the first area OA, the first inorganic encapsulation layer 310 and the second inorganic encapsulation layer 330 may contact each other. In the present exemplary embodiment, each of the first inorganic encapsulation layer 310, the organic encapsulation layer 320, and the second inorganic encapsulation layer 330 is shown as a single layer, but the present disclosure is not limited thereto. For example, in an exemplary embodiment of the present disclosure, at least one of the first inorganic encapsulation layer 310, the organic encapsulation layer 320, and the second inorganic encapsulation layer 330 may be provided in plurality or may be omitted.

Referring to a cross-sectional view of the display panel 10-1 of FIG. 9, the first area OA may be surrounded. For example, the grooves G of FIG. 9 may have a ring shape surrounding the first area OA when seen in a direction perpendicular to a top surface of the substrate 100 as shown in FIG. 8. Likewise, the partition wall PW may have a ring shape surrounding the first area OA when seen in the direction perpendicular to the top surface of the substrate 100. Likewise, the inorganic contact region ICR may have a ring shape surrounding the first area OA when seen in the direction perpendicular to the top surface of the substrate 100. Likewise, elements of FIG. 9, for example, elements provided in the intermediate area MA, may have a ring shape surrounding the first area OA when seen in the direction perpendicular to the top surface of the substrate 100.

Figure 16:
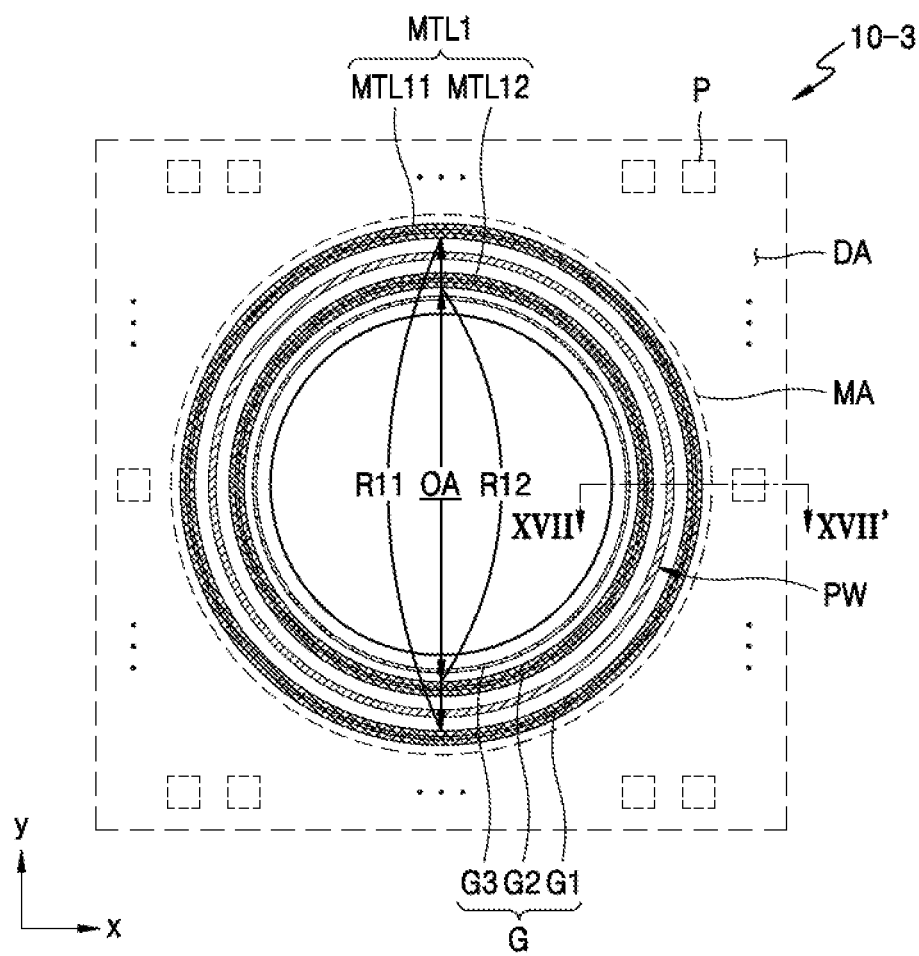
FIG. 16 is a plan view illustrating a part of a display panel according to an exemplary embodiment of the present disclosure.
Figure 17:
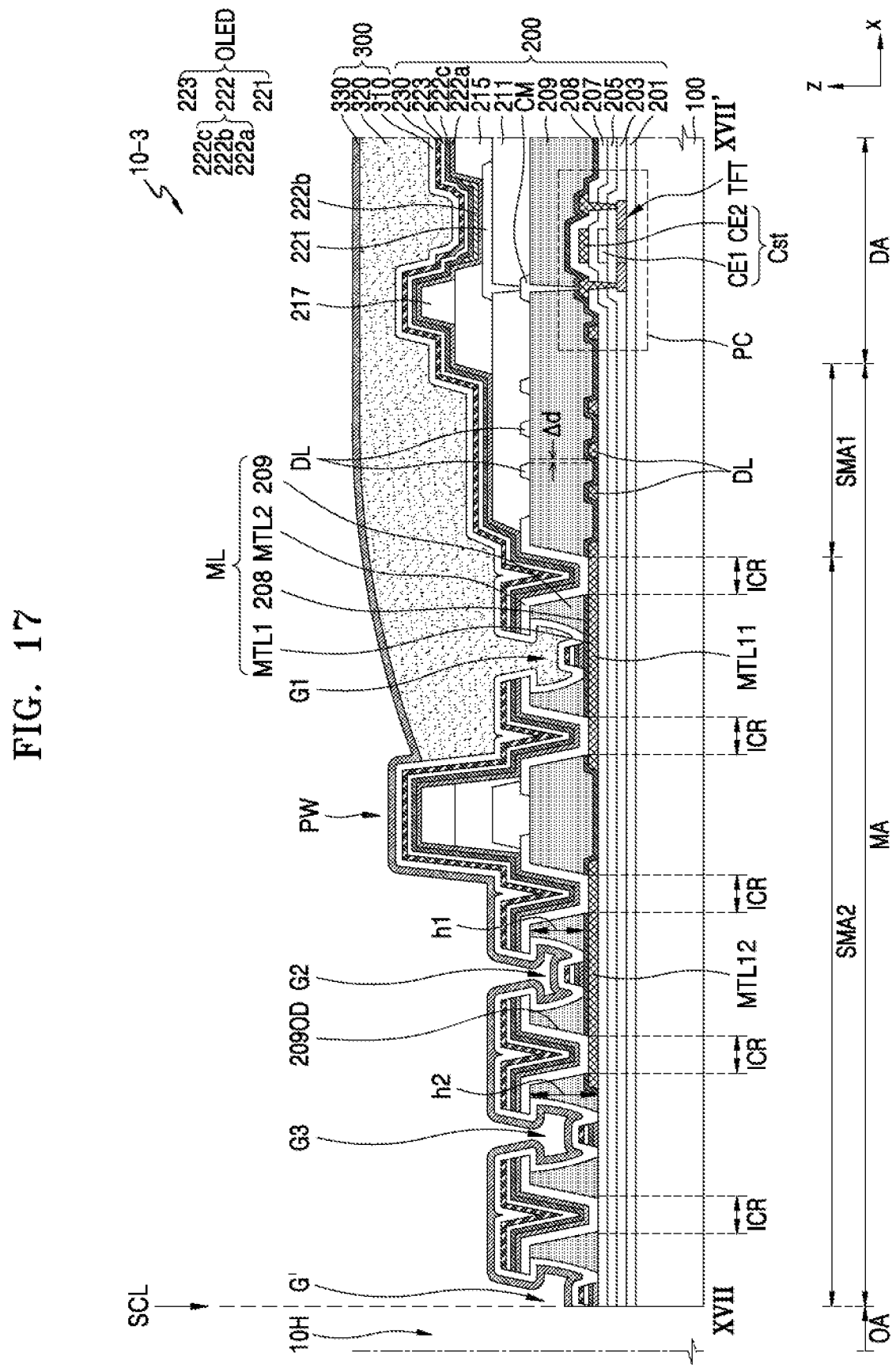
FIG. 17 is a cross-sectional view of the display panel according to an exemplary embodiment of the present disclosure.

FIG. 16 is a plan view illustrating a part of a display panel 10-3 according to an exemplary embodiment of the present disclosure, and FIG. 17 is a cross-sectional view of the display panel 10-3 according to an exemplary embodiment of the present disclosure, taken along line XVII-XVII' of FIG. 16.

Referring to FIG. 16, the partition wall PW and at least one groove G may be provided in the intermediate area MA to surround the first area OA. The at least one groove G may include the first groove G1 located at a side of the partition wall PW close to the display area DA, and the second groove G2 and a third groove G3 located at a side of the partition wall PW close to the first area OA. In this case, the second groove G2 may be a groove closest to the partition wall PW from among grooves located at a side of the partition wall PW close to the first area OA.

The first metal layer MTL1 may overlap some of the grooves G1, G2, G3, and G' in the intermediate area MA (see FIG. 17). Although the first metal layer MTL1 overlaps the first groove G1 and the second groove G2 in FIG. 16, the first metal layer MTL1 may not overlap the third groove G3. Although the first metal layer MTL1 discontinuously overlaps the first groove G1 and the second groove G2 in FIG. 16, the first metal layer MTL1 may be integrally formed to also overlap the partition wall PW as shown in FIGS. 11, 12, 13A and 13B. For example, the first metal layer MTL1 may be discontinuously located under the first groove G1 and the second groove G2 in FIG. 16, and the first metal layer MTL1 may be continuously located under the first groove G1, the partition wall PW and the second groove G2 as shown in FIGS. 11, 12 13A and 13B.

The first metal layer MTL1 may include a first sub-metal layer MTL11 corresponding to the first groove G1, and a second sub-metal layer MTL12 corresponding to the second groove G2. The first sub-metal layer MTL11 may be located relatively adjacent to the display area DA, and the second sub-metal layer MTL12 may be located relatively adjacent to the first area OA. Each of the first sub-metal layer MTL11 and the second sub-metal layer MTL12 may have a ring shape surrounding the first area OA, and in this case, a diameter R11 of the first sub-metal layer MTL11 may be greater than a diameter R12 of the second sub-metal layer MTL12.

Referring to FIG. 17, the display panel 10-3 is substantially the same as the display panel 10-1 of FIG. 9 except for characteristics of the grooves G1, G2, G3, and G' located in the intermediate area MA.

A display panel 10-3 may include three or more grooves G1, G2, G3, and G' located in the intermediate area MA. The inorganic contact region ICR may be located between adjacent grooves G1, G2, G3, and G', and the first functional layer 222a, the second functional layer 222c, the counter electrode 223, and/or the capping layer 230 may be disconnected by each of the grooves G1, G2, G3, and G'.

The display panel 10-3 may include the through portion 10H formed in the first area OA, and the through portion 10H may be formed by removing elements located in the first area OA by using a scribing or cutting process. The scribing or cutting process may be performed along a cutting line SCL, and FIG. 17 illustrates the display panel 10-3 manufactured by performing the scribing or cutting process or the like along the cutting line SCL.

The cutting line SCL may pass through one (e.g., G') of the grooves G1, G2, G3, and G'. In this case, a stacked structure including the first functional layer 222a, the second functional layer 222c, the counter electrode 223, and/or the capping layer 230 disconnected by the groove G' may face the through portion 10H. In an exemplary embodiment of the present disclosure, the cutting line SCL may be located between two adjacent grooves G from among the grooves G, and in this case, a side surface of the display panel defining the through portion 10H may be formed as shown in FIG. 9.

Although the first sub-metal layer MTL11 corresponds to the first groove G1 and the second sub-metal layer MTL12 corresponds to the second groove G2, the first metal layer MTL1 may not be located under the third groove G3. That is, the first metal layer MTL1 may be located under the first groove G1 closest to the partition wall PW and close to the display area DA and may be located under the second groove G2 closest to the partition wall PW and close to the first area OA, and may not be located under other grooves (e.g., G3 and G').

The first metal layer MTL1 may not be located under the groove G' that is an outermost groove overlapping the cutting line SCL along which a scribing or cutting process is performed. This is because cutting may not be easy when a metal layer is located on a cutting line portion during a scribing or cutting process for forming the through portion 10H. For example, when a laser cutting method is used and a metal layer is located on a cutting line portion, laser reflection may occur on the metal layer and it may not be easy to perform a cutting process on films under the metal layer.

According to whether the first metal layer MTL1 exists, a depth h2 of the third groove G3 under which the first metal layer MTL1 is not located may be greater than the depth h1 of each of the first and second grooves G1 and G2 under which the first metal layer MTL1 is located.

Although a bottom surface of the third groove G3 under which the first metal layer MTL1 is not located is located on an imaginary surface the same as a top surface of the second interlayer insulating layer 207 in FIG. 17, in an exemplary embodiment of the present disclosure, the bottom surface of the third groove G3 may be located on an imaginary surface between a top surface of the substrate 100 and a top surface of the first organic insulating layer 209. For example, the bottom surface of the third groove G3 may be located on an imaginary surface between the top surface of the substrate 100 and a top surface of at least one lower insulating layer under the first organic insulating layer 209. The at least one lower insulating layer may include the inorganic insulating layer 208.

Although each of the display panels 10-1, 10-2, and 10-3 of FIGS. 8 through 17 includes the through portion 10H corresponding to the first area OA, in an exemplary embodiment of the present disclosure, each of the display panels 10-1, 10-2, and 10-3 may not have a first opening 10H corresponding to the first area OA as described above with reference to FIGS. 4B through 4D.

A display panel 10 according to the exemplary embodiments of the present disclosure may prevent external impurities such as moisture from damaging display elements in the display area DA. However, this effect is merely an example, and effects according to the exemplary embodiments are described in detail through the description.

It should be understood that the exemplary embodiments of the present disclosure described herein should be considered in a descriptive sense only and not for purposes of limitation. Descriptions of features or aspects within each exemplary embodiment should typically be considered as available for other similar features or aspects. While the exemplary embodiments have been described with reference to the figures, it will be understood by one of ordinary skill in the art that various changes in form and details may be made therein without departing from the spirit and scope of the present disclosure as defined in the appended claims.

What is claimed is:
1. A display panel comprising:
   a substrate comprising a first area, a second area, and a third area located between the first area and the second area;
   a display layer comprising a pixel circuit located in the second area and a display element electrically connected to the pixel circuit, the display element comprising a pixel electrode, a counter electrode, and an intermediate layer located between the pixel electrode and the counter electrode and comprising an emission layer and at least one organic layer;
   a first metal layer located in the third area;
   an organic insulating layer located on the first metal layer and comprising at least one contact portion; and a second metal layer located on the organic insulating layer and contacting the first metal layer through the at least one contact portion,
wherein the second metal layer has a first hole, and the organic insulating layer has a second hole or a first recess corresponding to the first hole, and
a residual layer located in the second hole or the first recess and including a part of the at least one organic layer overlaps the first metal layer.

2. The display panel of claim 1, further comprising an inorganic insulating layer located between the first metal layer and the organic insulating layer.

3. The display panel of claim 2, wherein the second hole exposes at least a part of a top surface of the inorganic insulating layer.

4. The display panel of claim 2, wherein the second hole extends into the inorganic insulating layer and exposes at least a part of a top surface of the first metal layer.

5. The display panel of claim 2, wherein the at least one contact portion has a first opening defined in the organic insulating layer and a second opening defined in the inorganic insulating layer, and the first metal layer and the second metal layer are connected to each other through the at least one contact portion.

6. The display panel of claim 1, wherein the pixel circuit comprises a thin-film transistor (TFT) and a storage capacitor electrically connected to the display element, and
the second metal layer comprises a material the same as that of a contact metal layer that connects the display element to the TFT.

7. The display panel of claim 6, wherein the TFT comprises a semiconductor layer, a gate electrode overlapping the semiconductor layer, and a connection electrode electrically connected to the semiconductor layer, and
the first metal layer comprises a material the same as that of the connection electrode.

8. The display panel of claim 1, further comprising a data line extending in a first direction and configured to transmit a data signal to the display element,
wherein the data line comprises a material the same as that of at least one of the first metal layer and the second metal layer.

9. The display panel of claim 1, wherein the at least one organic layer comprises one or more of a hole transport layer, a hole injection layer, an electron injection layer, and an electron transport layer.

10. The display panel of claim 1, further comprising:
a partition wall located in the third area and surrounding the first area; and
at least one groove each comprising the first hole and the second hole or the first recess,
wherein the at least one groove comprises a first groove located at a side of the partition wall close to the second area and a second groove located at a side of the partition wall close to the first area.

11. The display panel of claim 10, wherein the first metal layer is located under the first groove.

12. The display panel of claim 10, wherein the first metal layer overlaps each of the first groove and the second groove and is discontinuously located under each of the first groove and the second groove.

13. The display panel of claim 10, wherein the first metal layer is located under the first groove, the partition wall, and the second groove.

14. The display panel of claim 10, wherein the at least one groove further comprises a third groove located closer to the first area than the second groove, and a depth of each of the first groove and the second groove, defined based on a top surface of the organic insulating layer, is less than a depth of the third groove.

15. The display panel of claim 14, further comprising at least one lower insulating layer located under the organic insulating layer,
wherein the at least one lower insulating layer comprises an inorganic insulating layer.

16. The display panel of claim 15, wherein a bottom surface of the third groove is located on an imaginary surface between a top surface of the substrate and a top surface of the at least one lower insulating layer.

17. The display panel of claim 1, wherein the first metal layer includes a floating metal disconnected from an electrical signal.

18. The display panel of claim 17, wherein the first metal layer has a ring shape surrounding the first area.

19. The display panel of claim 17, wherein, in a plan view, a width of the first metal layer is greater than a width of the second hole.

20. The display panel of claim 1, wherein the at least one contact portion of the organic insulating layer comprises a first contact portion and a second contact portion with at least one groove located therebetween.

21. The display panel of claim 2, wherein the inorganic insulating layer comprises a third hole or a second recess corresponding to the second hole and passing through the inorganic insulating layer.

22. A display apparatus comprising:
a display panel comprising a substrate comprising a first area, a second area, and a third area located between the first area and the second area; and
a component comprising an electronic element located to correspond to the first area,
wherein the display panel comprises:
a display layer comprising a pixel circuit located in the second area and a display element electrically connected to the pixel circuit and comprising a pixel electrode, a counter electrode, and an intermediate layer located between the pixel electrode and the counter electrode; and
a multi-layered film located in the third area and comprising a first metal layer, a second metal layer located on the first metal layer, and an organic insulating layer located between the first metal layer and the second metal layer, the first metal layer and the second metal layer contacting each other through at least one contact portion defined in the organic insulating layer,
wherein the multi-layered film comprises at least one groove adjacent to the at least one contact portion and defined in the multi-layered film, and at least one organic layer included in the intermediate layer is disconnected by the at least one groove.

23. A display panel comprising:
a substrate comprising a component area where a component configured to add various functions is located, a display area where a plurality of pixels configured to display image are located, and an intermediate area located between the component area and the display area;
a first metal layer located in the intermediate area and surrounding the component area;
an organic insulating layer located on the first metal layer and comprising at least one contact portion surrounding the component area;

a second metal layer located on the organic insulating layer and contacting the first metal layer through the at least one contact portion; and at least one groove located adjacent to the at least one contact portion, surrounding the component area, each having a first hole in the second metal layer and a second hole corresponding to the first hole in the organic insulating layer, and configured to disconnect any organic layer formed above the second metal layer.

24. The display panel of claim 23, further comprising an inorganic insulating layer located between the first metal layer and the organic insulating layer.

* * * * *

UNITED STATES PATENT AND TRADEMARK OFFICE
CERTIFICATE OF CORRECTION

PATENT NO. : 11,069,761 B2
APPLICATION NO. : 16/751428
DATED : July 20, 2021
INVENTOR(S) : Jeongho Lee et al.

It is certified that error appears in the above-identified patent and that said Letters Patent is hereby corrected as shown below:

On the Title Page

Item (72) Correct the fifth named inventor from KYUNGCAHN CHAE to KYUNGCHAN CHAE.

Signed and Sealed this
Twelfth Day of November, 2024

Katherine Kelly Vidal
*Director of the United States Patent and Trademark Office*